(12) United States Patent
Fafard et al.

(10) Patent No.: US 9,673,343 B2
(45) Date of Patent: Jun. 6, 2017

(54) TRANSDUCER TO CONVERT OPTICAL ENERGY TO ELECTRICAL ENERGY

(71) Applicant: AZASTRA OPTO INC., Ottawa (CA)

(72) Inventors: Simon Fafard, Ottawa (CA); Denis Paul Masson, Ottawa (CA)

(73) Assignee: AZASTRA OPTO INC., Ottawa (CA)

( * ) Notice: Subject to any disclaimer, the term of this patent is extended or adjusted under 35 U.S.C. 154(b) by 0 days.

(21) Appl. No.: 14/565,141

(22) Filed: Dec. 9, 2014

(65) Prior Publication Data

US 2015/0162478 A1 Jun. 11, 2015

Related U.S. Application Data

(60) Provisional application No. 61/913,675, filed on Dec. 9, 2013.

(51) Int. Cl.
| | |
|---|---|
| H01L 31/06 | (2012.01) |
| H01L 31/0304 | (2006.01) |
| H01L 31/0693 | (2012.01) |
| H01L 31/0735 | (2012.01) |
| H01L 31/103 | (2006.01) |
| H01L 31/109 | (2006.01) |
| H01L 31/18 | (2006.01) |

(52) U.S. Cl.
CPC ...... *H01L 31/0304* (2013.01); *H01L 31/0693* (2013.01); *H01L 31/0735* (2013.01); *H01L 31/109* (2013.01); *H01L 31/1035* (2013.01); *H01L 31/1852* (2013.01); *Y02E 10/544* (2013.01)

(58) Field of Classification Search
CPC . H01L 31/101; H01L 31/0304; H01L 31/028; H01L 31/0693; H01L 31/1852; H01L 31/1035; H01L 31/109; H01L 31/0735
See application file for complete search history.

(56) References Cited

U.S. PATENT DOCUMENTS

| | | | |
|---|---|---|---|
| 4,127,862 A | 11/1978 | Ilegems et al. | |
| 5,342,451 A | 8/1994 | Virshup | |

(Continued)

OTHER PUBLICATIONS

International Patent Application No. PCT/CA2014/051191, International Search Report and Written Opinion dated Mar. 10, 2015.

(Continued)

*Primary Examiner* — Allen Parker
*Assistant Examiner* — Wasiul Haider
(74) *Attorney, Agent, or Firm* — Louis B. Allard; Borden Ladner Gervais LLP

(57) ABSTRACT

A transducer to convert optical energy to electrical energy. The transducer or photo-transducer has a base layer which has a group of connecting elements formed therein at separations which are increasing with the distance away from an emitter layer formed atop the base layer. The connecting elements separate and electrically connect the base layer into base segments, the base segments having increasing thicknesses with the distance away from the emitter layer. The photo-transducer generates an output voltage that is greater than the input light photovoltage. The photo-transducer output voltage is proportional to the number of connecting elements formed in the base layer.

20 Claims, 11 Drawing Sheets

(56) References Cited

U.S. PATENT DOCUMENTS

| | | | |
|---|---|---|---|
| 6,903,533 B1 * | 6/2005 | Geren | H02J 7/0031 320/134 |
| 7,812,249 B2 | 10/2010 | King et al. | |
| 7,813,646 B2 | 10/2010 | Furey | |
| 8,073,645 B2 | 12/2011 | Fafard | |
| 8,742,251 B2 | 6/2014 | Werthen et al. | |
| 2004/0200523 A1 * | 10/2004 | King | H01L 31/036 136/262 |
| 2008/0197341 A1 * | 8/2008 | Mears | B82Y 20/00 257/21 |
| 2010/0326496 A1 | 12/2010 | Bhattacharya et al. | |
| 2011/0108082 A1 | 5/2011 | Werthen et al. | |
| 2012/0186641 A1 | 7/2012 | Sharps et al. | |
| 2012/0203387 A1 * | 8/2012 | Takayama | H01M 10/441 700/291 |
| 2012/0279563 A1 * | 11/2012 | Meier | H01L 31/022425 136/256 |
| 2012/0285519 A1 * | 11/2012 | Hoffman, Jr. | H01L 31/022425 136/255 |
| 2013/0133730 A1 * | 5/2013 | Pan | H01L 31/0725 136/255 |
| 2013/0337601 A1 * | 12/2013 | Kapur | H01L 31/06875 438/93 |

OTHER PUBLICATIONS

International Patent Application No. PCT/CA2014/051191, Form PCT/IB345, Third Party Observation dated Apr. 12, 2016.

SZE, "Photonic Devices", Semiconductor Devices—Physics and Technology, 2nd edition, Chapter 9, 2002, 6 pages.

* cited by examiner

TRANSDUCER TO CONVERT OPTICAL ENERGY TO ELECTRICAL ENERGY

CROSS REFERENCE TO RELATED APPLICATIONS

This application claims the benefit of priority of U.S. Provisional Patent Application No. 61/913,675 filed Dec. 9, 2013, which is hereby incorporated by reference.

FIELD

The present disclosure relates to devices that convert optical energy into electrical energy.

BACKGROUND

In the technological area of photovoltaics, there exist applications that require the efficient conversion of a narrowband optical input signal into an electrical output signal, for example by producing a direct current (DC) electrical output. In some of these applications, the narrowband optical input signal is provided by a laser or a light emitting diode.

Prior art devices for converting the optical input signal into the electrical output signal include photovoltaic single junction devices, which typically produce a low-voltage electrical output, which can be too constraining for designers. The prior art devices also include photovoltaic multi-junction devices that can have multiple photovoltaic junctions arranged in a same plane and electrically connected to each other in series. Such photovoltaic multi-junction devices can produce higher voltage output signal; however, they require that the multi-junctions have the same dimensions, be arranged symmetrically, and that the impinging narrowband input optical signal be shaped and directed towards the multi-junctions in a way that uniformly illuminates each junction. Further, such photovoltaic multi-junction devices can require complicated fabrication and assembly techniques including, for example, the need for a plurality of deep trenches with high aspect ratio etches in the various semiconductor layers, air bridge metal connectors, multi-level contacts and connections, thick doped semiconductor layers to minimize the sheet resistivity (for example for back contacts or top contacts), etc.

Therefore, improvements in transducer that convert an input optical signal into an output electrical signal are desirable.

SUMMARY

In a first aspect, the present disclosure provides a transducer to convert optical energy to electrical energy. The transducer comprises: a semiconductor emitter layer, the semiconductor emitter being one of n-doped and p-doped; semiconductor base layers, the semiconductor base layers being p-doped when the semiconductor emitter layer is n-doped, the semiconductor base layers being n-doped when the semiconductor emitter layer is p-doped, the semiconductor emitter layer and the semiconductor base layers each having a same bandgap energy, one of the semiconductor base layers adjoining the semiconductor emitter layer to form a p-n junction having associated thereto a first electric potential; and at least one connecting element formed between adjacent semiconductor base layers to electrically connect the adjacent semiconductor base layers to each other, each connecting element being configured to generate a respective additional electric potential between the adjacent semiconductor base layers, each respective additional electric potential being equal to the first electric potential. The transducer has an overall electric potential that is equal to the sum of the first electric potential and of each respective additional electric potential. The transducer is to receive light that propagates through, and is partially absorbed in, the semiconductor emitter layer and then sequentially propagates through, and is partially absorbed in, each of the semiconductor base layers, each semiconductor base layer having a thickness designed to absorb a same number of photons.

In a second aspect, the present disclosure provides a transducer to convert optical energy to electrical energy. The transducer comprises: a light-input surface; a semiconductor emitter layer, the semiconductor emitter being one of n-doped and p-doped; semiconductor base layers, the semiconductor base layers being p-doped when the semiconductor emitter layer is n-doped, the semiconductor base layers being n-doped when the semiconductor emitter layer is p-doped, the semiconductor emitter layer and the semiconductor base layers each having substantially a same bandgap energy, one of the semiconductor base layers adjoining the semiconductor emitter layer to form a p-n junction having associated thereto a first electric potential; and at least one connecting element formed between adjacent semiconductor base layers to electrically connect the adjacent semiconductor base layers to each other, each connecting element being configured to generate a respective additional electric potential between the adjacent semiconductor base layers, each respective additional electric potential being substantially equal to the first electric potential. The transducer has an overall electric potential that is equal to the sum of the first electric potential and of each respective additional electric potential. The light-input surface is to receive light and to transmit the light to the semiconductor emitter layer, the light to propagate through, and be partially absorbed in, the semiconductor emitter layer and to sequentially propagate through, and be partially absorbed in, each of the semiconductor base layers, each semiconductor base layer having a thickness designed to absorb a same number of photons.

In a third aspect, the present disclosure provides a transducer and data receiver unit that comprises: a transducer to convert optical energy to electrical energy, the transducer having: a semiconductor emitter layer, the semiconductor emitter being one of n-doped and p-doped; semiconductor base layers, the semiconductor base layers being p-doped when the semiconductor emitter layer is n-doped, the semiconductor base layers being n-doped when the semiconductor emitter layer is p-doped, the semiconductor emitter layer and the semiconductor base layers each having a same bandgap energy, one of the semiconductor base layers adjoining the semiconductor emitter layer to form a p-n junction having associated thereto a first electric potential; and at least one connecting element formed between adjacent semiconductor base layers to electrically connect the adjacent semiconductor base layers to each other, each connecting element being configured to generate a respective additional electric potential between the adjacent semiconductor base layers, each respective additional electric potential being equal to the first electric potential. The transducer has an overall electric potential that is equal to the sum of the first electric potential and of each respective additional electric potential. The transducer is to receive light that propagates through, and is partially absorbed in, the semiconductor emitter layer and then sequentially propagates through, and is partially absorbed in, each of the semiconductor base layers, each semiconductor base layer having a thickness designed to absorb a same number of photons; and an optical detector to detect an optical data signal having associated thereto a photon energy that is less than a photon energy of the light absorbed in the transducer unit, the optical detector comprising a Ge substrate and a p-n junction formed in the Ge substrate, the transducer unit being formed upon the Ge substrate.

In a fourth aspect, the present disclosure provides a power meter unit that comprises: a transducer to convert optical energy to electrical energy, the transducer comprising: a light-input surface; a semiconductor emitter layer, the semiconductor emitter being one of n-doped and p-doped; semiconductor base layers, the semiconductor base layers being p-doped when the semiconductor emitter layer is n-doped, the semiconductor base layers being n-doped when the semiconductor emitter layer is p-doped, the semiconductor emitter layer and the semiconductor base layers each having substantially a same bandgap energy, one of the semiconductor base layers adjoining the semiconductor emitter layer to form a p-n junction having associated thereto a first electric potential; and at least one connecting element formed between adjacent semiconductor base layers to electrically connect the adjacent semiconductor base layers to each other, each connecting element being configured to generate a respective additional electric potential between the adjacent semiconductor base layers, each respective additional electric potential being substantially equal to the first electric potential. The transducer has an overall electric potential that is equal to the sum of the first electric potential and of each respective additional electric potential. The light-input surface is to receive light and to transmit the light to the semiconductor emitter layer, the light to propagate through, and be partially absorbed in, the semiconductor emitter layer and to sequentially propagate through, and be partially absorbed in, each of the semiconductor base layers, each semiconductor base layer having a thickness designed to absorb a same number of photons, readout circuitry operationally connected to the transducer, the readout circuitry to obtain a signal from the transducer, the signal being indicative of an optical power of light impinging on the transducer, the readout circuit to generate an output electrical signal; a processor operationally connected to the readout circuitry, the processor to obtain the output electrical signal; charging circuitry operationally connected to the processor; and a battery operationally connected to the charging circuitry, the processor to control the charging circuitry to charge the battery in accordance with the electric signal.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

DETAILED DESCRIPTION

Generally, the present disclosure provides a Harmonic Photovoltage Up-converter for High-Efficiency Photon to Direct-Current (DC) Photo-Transducer Power Conversion Applications. A transducer converts one form of energy into another form of energy, for example optical energy into electrical energy. The photo-transducer of the present disclosure converts an optical input into and an electrical output preferably with a high conversion efficiency based on a direct current/voltage output. The optical input preferably consists of a beam of light, for example a laser light beam. The beam of light is typically propagated from the source to the photo-transducer. The propagation of the beam of light can be done with a collimated beam thru free-space, such as air, other gases, or vacuum. Alternatively the propagation of the beam of light can be done a solid such as an optical fiber, a waveguide, or a light guiding medium which can also include liquid a medium. For example the photo-transducer of the present disclosure can be place at the receiving end of a light beam propagated thru an optical fiber to deliver power from a distant source to a remote equipment which will use the voltage or current converted by the photo-transducer. For clarity, a light source, preferably in the form of a beam, provides an optical input for the photo-transducer of the present disclosure.

Figure 1:
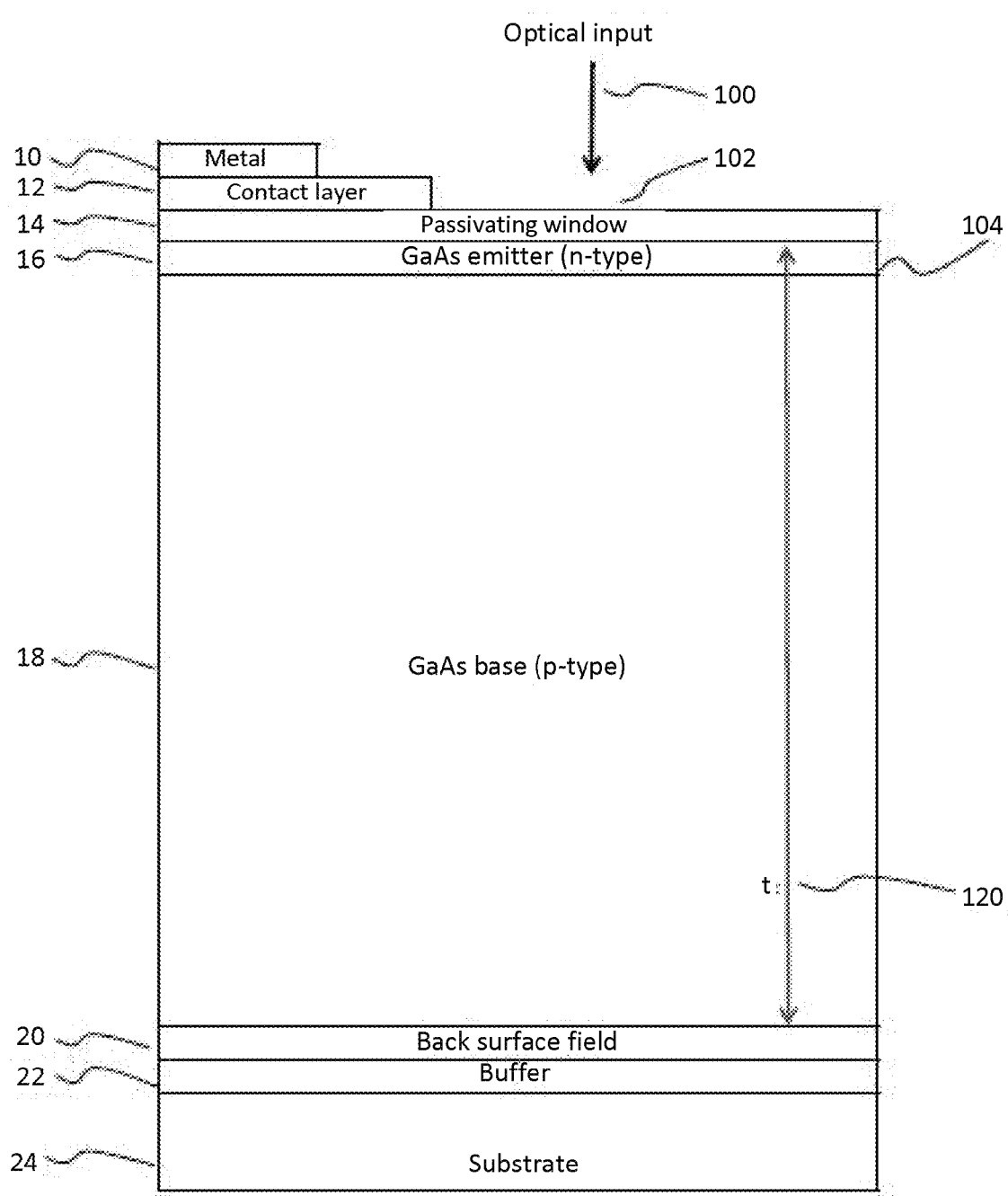
FIG. 1 shows a prior art p-n junction.

State-of-the-art PV devices are most often based on a single p-n junction such as shown in FIG. 1, which includes an emitter 16 and a base 18 made of semiconductors doped with dopants of opposite polarity (p or n). The base 18 and the emitter 16 form a p-n junction 104, and together have a thickness (t) 120 of semiconductor material that absorbs an optical input 100 which is impinging the front surface 102 of the PV device. The performance of the single junction PV device can be improved by using a passivating window 14, doped with the same doping type as the emitter 16 and disposed between the front surface 102 and the emitter 16. A contact layer 12 and/or a metal layer 10 can be used to extract the current and voltage generated by the single junction PV device. The contact layer 12 and/or the metal layer 10 can be patterned using standard photolithography techniques or deposited such that only a fraction of the front surface 102 is covered in order to efficiently let the optical input reach the absorbing thickness 120 of the semiconductor emitter 16 and base 18.

Optically transparent but electrically conducting layers can also be used in conjunction with or in substitution to the contact or metal layers 12, 10. The layers such as the base 18 and the emitter 16 are typically grown on a substrate 24 which can serve as a mechanical support and which can define the lattice constant of the semiconductor crystal grown on the substrate 24. A buffer layer 22 can be disposed between the substrate 24 and the base 18 to adjust the crystal quality and or for other fabrication, optical, electrical, or crystal growth purposes. For example the buffer 22 can be used to provide electrical conductivity (lateral sheet conductivity or vertical conductivity to extract the current) or to change the optical properties of the single junction PV device. The performance of a single junction PV device can be further improved by using a back surface field (BSF) layer 20, doped with the same doping type as the base 18 and disposed between the substrate 24 and the base 18. The optical input 100 is absorbed within the thickness 120 of the emitter and base, and the minority photo-carriers in the base and in the emitter are swept across the p-n junction 104 developing a photo-current and photo-voltage across an external circuit which can be connected to the top metal 10 and the substrate 24.

For a PV device, the optimum conversion performance, often referred to as the conversion efficiency, defined as the ratio of the optical power impinging from on the PV device to the electrical power output from the PV device, is obtained when the PV device is operated near or at the maximum power point of the current-voltage curve (I-V curve) of the PV device. The maximum power point of the I-V curve corresponds to the point at which the product of the output voltage (Vmax) and the output current (Imax) has reached a maximum. That point defines the fill-factor coefficient (also known has the filling factor coefficient) FF=(Vmax*Imax)/(Voc*Isc), where Voc is the open circuit voltage of the PV device and Isc is the short current value of the PV device. It is sometimes also convenient to define the 'voltage FF' (FFv), and the 'current FF' (FFi) as FFv=Vmax/Voc and FFi=Imax/Isc, such that FF=FFv*FFi. The PV device can be operated under different current-voltage settings by changing the impedance of the load to which it is electrically connected. For example an external load connected to the PV device with the optimal impedance, also known as the optimum load, optimum impedance, or optimum circuit resistance, will drive the photo-transducer to operate near its maximum power point.

The optical input signal has a light wavelength ($\lambda$ or lambda), a light frequency ($\nu$), a light energy (or photon energy) $E=h\nu$ or equivalently $E=hc/\lambda$, where h is Planck's constant and c is the speed of light. The optical input signal can be monochromatic in which case the photons comprising the optical input all have the same wavelength and frequency. The optical input signal can comprise a band of wavelength or colors, in which case the photons comprising the optical input all have a wavelength and frequency around a mean value. The width of the band of wavelength can be referred to as the bandwidth of the optical input signal. For example the optical input signal can be broadband or narrowband. The optical input signal can have more than one band of wavelengths, for example multiple bands each band being centered at a mean frequency. In the case of multiband optical input signals, the PV device can be optimized for one of the band of wavelengths. For the description below, when the light input has a band of frequencies or wavelengths, then the mean frequency or wavelength of that band will be taken as the frequency or the wavelength of the optical input signal. In the case for which the optical input has a band of frequencies or wavelengths, then the PV device can be optimized for a narrow band optical input, for example, for a bandwidth of less than 500 nm, or a bandwidth of less than 100 nm, or a bandwidth of less than 20 nm.

The optical input signal can be said to have an equivalent light photovoltage: $h\nu/e$, where e is the charge of the electron. For example if the optical input has a wavelength of $\lambda=830$ nm, the light energy is $E=1240$ eV*nm/830 nm=1.494 eV. Then the light photovoltage of the optical input signal is 1.494V. The transducer of the present disclosure is capable of converting the optical input signal to voltage that is greater than that of the optical input photovoltage. For example, in some embodiments, the transducer of the present disclosure is capable of converting and optical input signal having a photovoltage of about 1.5 volts into an electrical output voltage comprised between 2V and 20V, or between 2V and 12V, or between 2V and 8V. The output voltage of the transducer can be the maximum power voltage point of the transducer (often labelled Vmpp, or Vmax). Alternatively, the photovoltage output of the photo-transducer can be any voltage that the device can produce between 0V and the open circuit voltage Voc. The photo-current output of the transducer can be the maximum power current point of the transducer (often labelled Vmpp, or Vmax). Alternatively, the photocurrent output of the transducer can be any current that the device can produce between 0 A and the short-circuit current Isc.

Figure 2:
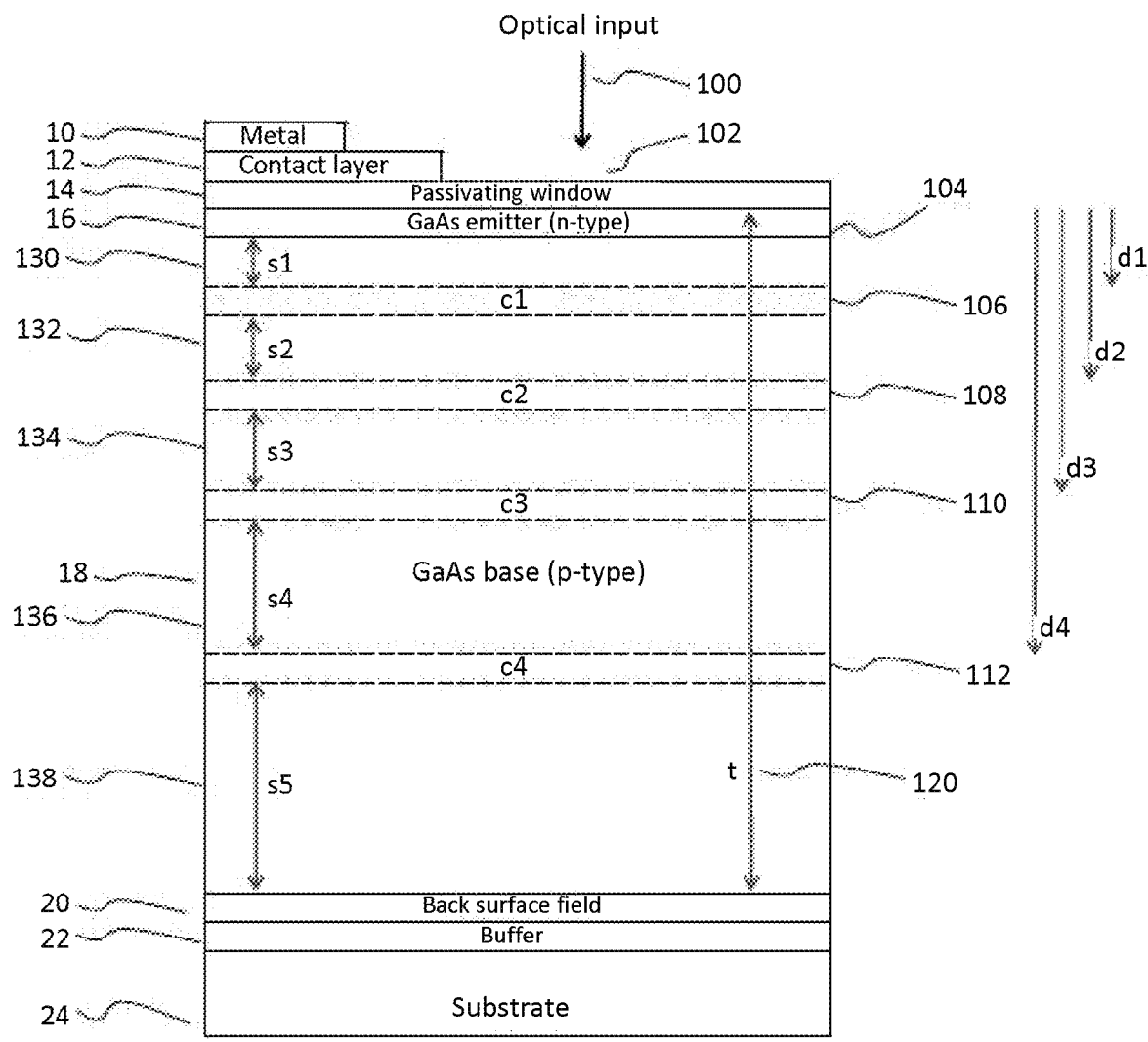
FIG. 2 shows an embodiment of a transducer in accordance with the present disclosure.

An embodiment a transducer of the present disclosure is shown in FIG. 2. Similarly to a state-of-the-art single junction PV device of the prior art shown in FIG. 1, the photo-transducer device of the present disclosure in FIG. 2 includes a base 18, and an emitter 16 made of semiconductors doped with dopants of opposite polarity (p or n). The base and the emitter form a p-n junction 104, and together have a thickness (t) 120 of semiconductor material absorbing the optical input signal 100 which is impinging the front surface 102 of the transducer. The present embodiment includes a passivating window 14, doped with the same doping type as the emitter and disposed between the front surface 102 and the emitter 16. A contact layer 12 and/or a metal layer 10 can be used to extract the current and voltage generated by the transducer device. The contact layer and/or the metal layers can be patterned using standard photolithography techniques or deposited such that only a fraction of the front surface 102 is covered in order to efficiently let the optical input reach the absorbing thickness 120 of the semiconductor emitter 16 and base 18. Optically transparent but electrically conducting layers can also be used in conjunction with or in substitution to the contact or metal layers 12, 10. The layers such as the base 18 and the emitter 16 are typically grown on a substrate 24 which serves as a mechanical support and which defines the lattice constant of the semiconductor crystal. A buffer layer 22 can be disposed between the substrate 24 and the base 18 to adjust the crystal quality and or for other fabrication, optical, electrical, or crystal growth purposes. For example the buffer 22 is preferably used to provide electrical conductivity (lateral sheet conductivity or vertical conductivity to extract the current) or to change the optical properties of the PV device. A back surface field (BSF) layer 20 is preferably used, doped with the same doping type as the base 18 and disposed between the substrate 24 and the base 18. The BSF and window layers are preferably used to reflect the minority carriers back toward the p/n junction. For example if the base is p-type, the minority carriers in the base are the photo-electrons, then the emitter would be n-type and the minority carriers in the emitter would be the photo-holes. In that case the window would preferably have a band discontinuity in the valence band to reflect the minority holes in the emitter back toward the p/n junction 104, and the BSF would preferably have a band discontinuity in the conduction band to reflect the minority electrons in the base back toward the p/n junction 104. The optical input 100 is absorbed within the thickness 120 of the emitter and base, and the minority photo-carriers in the base and in the emitter are swept across the p/n junction 104 developing a photo-current and photo-voltage across an external circuit which can be connected to the top metal 10 and the substrate 24.

Furthermore, the embodiment of the present disclosure incorporates connecting elements 106 (c1), 108 (c2), 110 (c3), and 112 (c4). The connecting elements are positioned at a specific distances away from the surface of the emitter 104 closest to the front surface 102. For example as illustrated in FIG. 2, connecting element c1 106 is positioned at a distance d1 from the emitter and window interface, similarly connecting element c2 108 is positioned at a distance d2 from the emitter and window interface, connecting element c3 110 is positioned at a distance d3 from the emitter and window interface, connecting element c4 112 is positioned at a distance d4 from the emitter and window interface. FIG. 2 exemplifies an embodiment with 4 connecting elements; other embodiments can include more than 4 connecting elements or less than 4 connecting elements without departing from the scope of the present disclosure.

FIGS. 3, 4, 5, and 6 make use of semiconductor band diagrams to illustrate how the electrical output voltage of the transducer can be made higher than the input light photo voltage (hv/e) by using connecting elements in accordance with the present disclosure.

Figure 3:
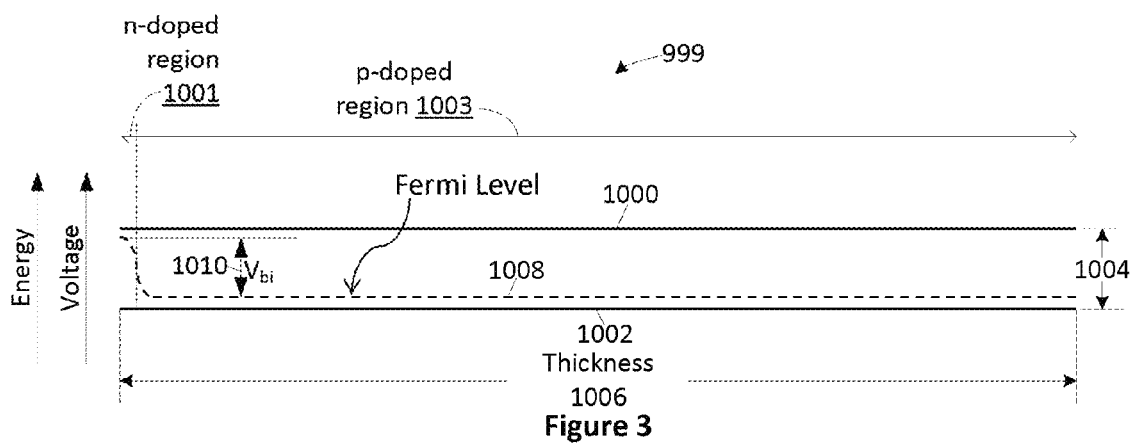
FIG. 3 shows a flat band energy diagram of a homogeneous p-n diode.

FIG. 3 shows a flat band energy diagram of a homogeneous p-n diode 999 in equilibrium with no biasing and no illumination. The lines 1000 and 1002 represent respectively, the conduction band and the valence band. The bandgap energy 1004 is the energy difference between the conduction band 1000 and valence band 1002. The length 1006 of the lines represents the thickness of the semiconductor layers that make up the p-n diode 999. The dotted line 1008 represents the Fermi level (Ef) through the p-n diode 999. The position of the Fermi level 1008 with respect to the conduction and valence band is determined by the doping concentration of the semiconductor material present in the p-n diode 999 and the type of donors, n-type or p-type. The p-n diode 999 has an n-doped region 1001 and a p-doped region 1003. The n-doped region 1001 is the emitter region, the p-doped region is the base region. The Fermi level 1008 is comprised between the valence band 1002 and the conduction band 1000. The doping characteristics of the semiconductor material or materials that make up the p-n diode can be chosen to have the Fermi level 1008 to be within KT~0.025 eV or less from the conduction band in n-type material and similarly within 0.025 eV or less from the valence band in p-type material in order to thermally activate as many donors as possible. "KT" is the product of the Boltzman's constant K and the temperature T in kelvins. This is shown in the flat band energy diagram of FIG. 3, where the Fermi level 1008 shifts its position with respect to the conduction band 1000 and with respect to the valence band 1002 throughout the p-n diode 999 going from the n-doped region 1001 to the p-doped region 1003. The shift or variation in the Fermi level 1008 from the n-doped region 1001 to the p-doped region 1003 can be referred to as a built-in electric potential or as an electric potential 1010, which can be denoted $V_{bi}$. The built-in electric potential 1010 defines the turn-on voltage of the p-n diode. The built-in potential 1010 also defines the voltage produced by the p-n diode 999 upon being illuminated with light having an energy at least equal to that of the bandgap energy 1004. Examples of built-in potentials include, for Si, about 0.7 eV; for GaAs, 1 eV; for InP, 1.3 eV; for Ge, 0.3 eV, for InGaAs, 0.4 eV; for InGaP, 1.4 eV; for AlInP, 2.0 eV; for AlInAs, 1.2 eV; for InAs, less than 0.1 eV. Heterogeneous semiconductors that comprise two or more different semiconductors have built-in potential that are commensurate with their composition.

The p-n diode 999 can absorb light in accordance with an absorption coefficient, which is a function of the materials that make the p-n diode. The total amount of light that can be absorbed by the p-n diode is a function of the absorption coefficient and of the thickness 1006 of the p-n diode.

Figure 4:
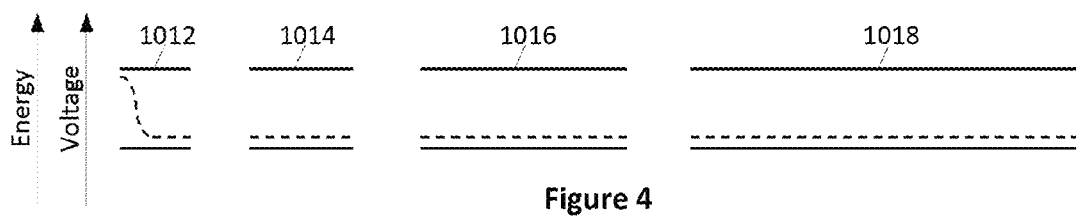
FIG. 4 shows four segments of the p-n diode of FIG. 3.

FIG. 4 shows four segments 1012, 1014, 1016, and 1018 of the p-n diode 999 of FIG. 3. The four segments of FIG. 4 are shown spaced-apart for clarity reasons; however, it is to be understood that the sum of the thicknesses of the segments is equal to the thickness 1006 shown at FIG. 3.

Figure 5:
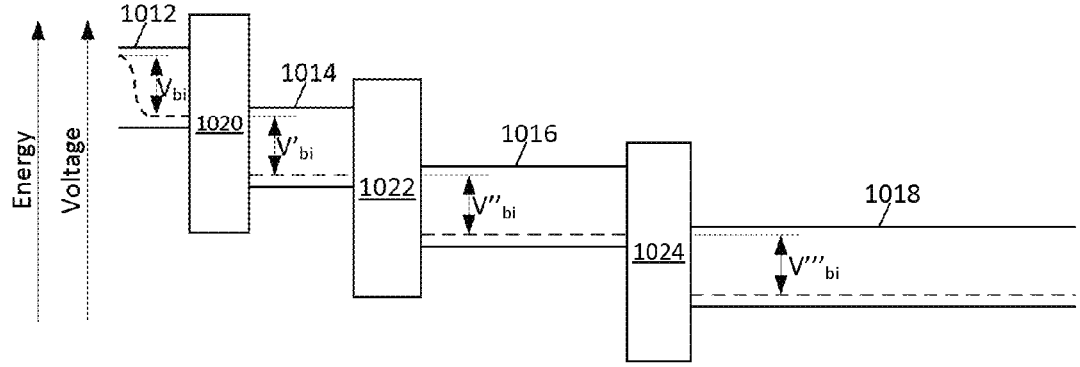
FIG. 5 shows the four segments of FIG. 3 electrically connected to each other with connecting elements.

FIG. 5 shows the four segments 1012, 1014, 1016, and 1018 electrically connected to each other with connecting elements 1020, 1022, and 1024. Each connecting element adjoins (i.e., is in contact with) two of the four segments. Each connecting element is configured to introduce an electric potential between the segments to which each connecting element is connected (electrically connected). The successive built-in electric potentials $V_{bi}$, $V'_{bi}$, $V''_{bi}$, and $V'''_{bi}$ add up to introduce a total built-in electric potential equal to $V_{total} = V_{bi} + V'_{bi} + V''_{bi} + V'''_{bi}$. When all the built-in electric potentials are equal to $V_{bi}$, $V_{total} = 4*V_{bi}$.

Figure 6:
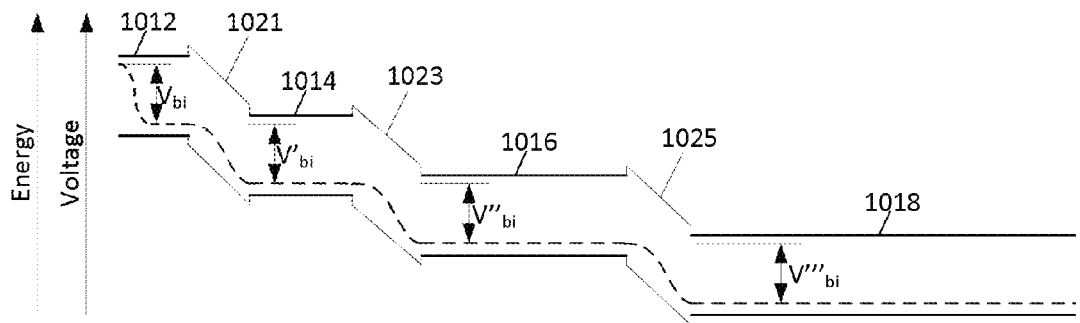
FIG. 6 shows an embodiment of a transducer of the present disclosure that has connecting elements that form tunnel diodes.

FIG. 6 shows an embodiment of a transducer of the present disclosure where the connecting elements comprise highly doped semiconductors that form tunnel diodes 1021, 1023, and 1025. One skilled in the art would know that a pair of highly doped layers comprising a highly doped n-type layer adjacent to a highly doped p-type layer can form a tunnel diode, which, when combined with other semiconductor layers can be referred to as a tunnel diode unit. The tunnel diode unit can be used to pass current from one section to another and or change the polarity of the semiconductor layer sequence in the heterostructure. The n and the p doping level can be $10^{18}$ cm$^{-3}$ or higher up to $5\times10^{21}$ cm$^{-3}$.

Each of FIGS. 3, 4, 5, and 6 has a pair of vertical scales, one of which corresponds to energy and the other to voltage. In each of FIGS. 3, 4, 5, and 6, the p-n diode receives light at the emitter side, which is at the n-doped region 1001 side.

FIGS. 3, 4, 5, and 6 show an equilibrium situation where no external voltage is applied and no light is present. In practice, transducers (photo-transducers) operate in a forward bias mode with impinging light. A person skilled in the art will understand that the concepts of quasi Fermi levels for both electrons and holes can be introduced to better fine tune and optimize these practical situations. However, the basic principles leading to the output voltage of a transducer being higher than the input light photo-voltage (hv/e) are well and illustrated in these Figures, which are described above.

Figure 7:
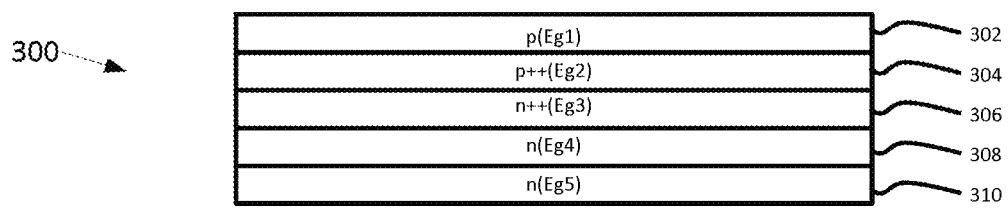
FIG. 7 shows an embodiment of a connecting element of the present disclosure.

FIG. 7 shows an example of a connecting element 300 that can be used as the connecting element c1 106, c2, 108, c3, 110, and/or c4 112 shown in FIG. 2; the connecting element 300 of FIG. 7 can also be used as the connecting element 1020, 1022, and/or 1024 shown at FIG. 5. The following describes the connecting element 300 in relation to base segments 1014, 1016, and 1018 of FIG. 5. The connecting element 300 comprises a first layer 302 closest to the front surface of the photo-transducer (closest to the n-doped region 1001 shown at FIG. 3) and is p-doped, as are the base elements 1014, 1016, and 1018 of FIG. 4. The bandgap Eg1 of layer 302 is greater than the bandgap energy of the base elements 1014, 1016, and 1018, and, as such, the layer 302 is transparent to the optical input signal, which has a photon energy value close to that of the bandgap energy 1004 (see FIG. 3).

The connecting element 300 further comprises a second layer 304 that is electrically connected to first layer 302. The second layer 304 is also p-doped; however, the concentration of dopants in the second layer 304 is higher than in the first layer 302. The bandgap Eg2 of second layer 304 is greater than the bandgap energy of the base elements 1014, 1016, and 1018 and, as such, the second layer 304 is transparent to the optical input signal.

The connecting element 300 further comprises a third layer 306 that is electrically connected to the second layer 304. The third layer 306 is n-doped with a high concentration of dopants, the concentration of dopants in the third layer 306 is similar to that of the second layer 304. The bandgap Eg3 of layer 306 is greater than the bandgap energy of the base elements 1014, 1016, and 1018 and, as such, the second layer 304 is transparent to the optical input signal.

The connecting element 300 further comprises a fourths layer 308 electrically connected to the third layer 306 and is n-doped but preferably but at a dopant concentration that is lower than that of the third layer 306. The bandgapEg 4 of layer 308 is greater than the bandgap energy of the base elements 1014, 1016, and 1018 and, as such, the second layer 304 is transparent to the optical input signal.

The connecting element 300 further comprises a fifth layer 310 electrically connected to the fourth layer 308. The fifth layer 310 is n-doped at a similar or lower dopant concentration than the fourth layer 308. The bandgap Eg5 of layer 310 is the same or greater than the bandgap of the base elements 1014, 1016, and 1018. In the present embodiment, the first layer 302, the second layer 304, the third layer 306, and the fourth layer 308 can be said to form a tunnel diode unit. The fifth layer 310 can be referred to as an intermediate layer that adjoins the tunnel diode unit and a base layer (which is not shown in FIG. 7).

Figure 8:
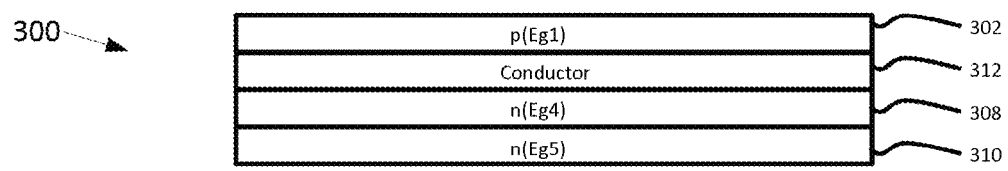
FIG. 8 shows another embodiment of a connecting element of the present disclosure.

Numerous other embodiments of the connecting elements 300 can be designed by incorporating a number of semiconductor layers either fewer or higher than the layers illustrated and described in FIG. 7, and without departing from the scope of the present disclosure. As an example, FIG. 8 shows an embodiment where, instead of having the second and third layers 304 and 306, there is a conductor layer 312. Other specific examples are described further below. N-type and p-type doping of the various layers of transducer can be effected through any suitable technique using any suitable type of dopants. For an example, for InP, GaAs, and related compounds, n-type doping can effected by, for example, Si, Ge, Te, S, Sn atoms, and p-type doping can be effected by, for example, Zn, C, Cd, Mg, Si, Ge, Cr, and Be atoms.

The number of connecting elements present in a transducer in accordance with the present disclosure will determine the output voltage of the transducer: for example, when the output voltage of the p-n diode 999 of FIG. 3 element has a value X, then the output voltage of a transducer of the present disclosure having on connecting element will be approximately 2×, or, the output voltage of a transducer of the present disclosure designed with two connecting elements will be approximately 3×, or the output voltage of a transducer of the present disclosure designed with three connecting elements will be approximately 4×, or, the photovoltage of the a transducer of the present disclosure designed, as illustrated in FIG. 2, with 4 connecting element c1 106, c2 108, c3 110, and c4 112 will be approximately 5×. The exact value of the voltage (photovoltage) generated by each base segment may vary slightly. The variations can be caused for example because of the different thickness of the individual base segments, because of a different built-in electric fields resulting from different thicknesses or doping profiles, because of a different doping concentration in each base segment, because of the photon reabsorption from one base segment to another, or because of other growth or fabrication parameters such as the growth temperature used during the growth of the various segments, or slight variations in alloy composition during the growth. For example, a thinner base segment will typically generate a higher photovoltage, due to the higher probability of extraction of the photo-carriers. For example, the above, or other, intrinsic or extrinsic effects can result in different effective ideality factors, or n-factors, in the various base segments. Importantly, the transducer of the present disclosure can readily benefit from higher photo-voltages generated from such thinner base segments. This is in contrast to the case for which a prior art photo-transducer is constructed without the multiple base segments and connecting elements disclosed herein. In the latter case, a prior art photo-transducer that would be designed with a p-n junction having a thinner base would also typically exhibit a higher photovoltage than the equivalent p-n junction having a thicker base, but it would have lower overall performance because the thinner base will not be capable of absorbing all of the photons from the optical input. In the present disclosure, the input light that is not absorbed in the upper base segments is absorbed in the lower base segments, such that substantially all the photons of the optical input are absorbed. However, because each individual base segment is thinner than the base segment thickness that would be necessary to absorb all the incoming light, each base segment can generate a slightly higher photovoltage than it would if it had been thicker.

As will be understood by the skilled, the number of connecting elements required is commensurate with the desired output voltage of a transducer in accordance with the present disclosure. For example, if X is the output voltage of a p-n diode such as shown at reference numeral 999 in FIG. 3, which does not have any collecting element, the Y=(n+1)X will be the output voltage of a transducer according to the present disclosure having n connecting element, where n is an integer number having any suitable value. For example n can be comprised between 1 and 20, or between 1 and 10, or between 1 and 5. That is the output voltage of a transducer according to the present invention is a multiple of the output voltage of a similar transducer that does not incorporate any connecting element. Correspondingly, it could be said that the photovoltage of the photo-transducer according to the present invention as an output photovoltage which is a harmonic value of the photovoltage of a similar PV device not incorporating the connecting elements, as illustrated in FIG. 2 and described herein. For clarity, the harmonic value or the multiplication factor of the output voltage of the present disclosure is determined by the number of connecting elements formed in the transducer.

With reference to FIGS. 1 and 2, to achieve the desired optoelectronic properties of the photo-transducer of the present disclosure, the connecting elements in the embodiment of FIG. 2 divide the thickness t of the base 18 of the transducer into multiple base segments. For example the base segment s1 130, the base segment s2 132, the base segment s3 134, the base segment s4 136, and the base segment s5 138, as illustrated in FIG. 2. The thicknesses of the various base segments (s 1, s2, s3, s4, s5) can be the same or they can be different by adjusting the position of the connecting elements. That is the position d1 of c1, the position d2 of c2, the position d3 of c3, and the position d4 of c4 can be adjusted to change the thicknesses of the various base segments. The values of d1, d2, d3, d4 can be chosen such that the thickness of s5 138 is greater than the thickness of s4 136, and the thickness of s4 136 is greater than the thickness of s3 134, and the thickness of s3 134 is greater than the thickness of s2 132, the thickness of s2 132 is greater than the thickness of s1 130.

The value of d1, d2, d3, d4 can be chosen such that each base segment (s1, s2, s3, s4, s5) absorb substantially the same fraction of the photons from the optical input 100. For example S1 absorbs 20% of the photons from the optical input, s2 absorbs 20% of the photons from the optical input, s3 absorbs 20% of the photons from the optical input, s4 absorbs 20% of the photons from the optical input, and s5 absorbs 20% of the photons from the optical input. To obtain an ideal photo-transducer, all the base segments taken together absorb substantially all the photons from the optical input 100. But for manufacturing or cost considerations, and depending on the application for the photo-transducer, it may be desirable that all the base segments together absorb less than all the photons from the optical input 100. For example, the various base segments 51, s2, s3, s4, and s5 can absorb each 19.8% of the optical input 100. It will also be clear for one skilled in the art that the thickness t of the base 18 and the absorption coefficient of the semiconductor material used to construct the base will be important factors in determining the fraction of the optical input signal absorbed by each base segment and in total by the group of base segments all together.

Therefore, for most direct bandgap III-V semiconductors, the thickness t of the base 18 will not exceed 5 microns and will, in some embodiment, be between 3 microns and 4 microns. For example, neglecting the reflection at the surface of the transducer, which is a valid approximation for transducer having an antireflection coating at the front surface 102, the light intensity transmitted at a depth z from the surface of the semiconductor is given by $I(z)=I_o \exp(-\alpha z)$. $I_o$ is the input intensity (such as the initial intensity of the optical input signal 100 in FIG. 2) and $\alpha$ is the semiconductor absorption coefficient, which is a function of the wavelength dependent density of states of the material (i.e., $\alpha$ is wavelength dependent). For sufficiently thick semiconductor material, only light having a wavelength longer than the semiconductor bandgap equivalent wavelength (or with an energy less than the bandgap energy) will transmit through the semiconductor layer since the density of states drops, as does $\alpha$, for photon energies less than the bandgap energy. For direct bandgap semiconductors, at wavelengths shorter than the bandgap wavelength, $\alpha$ is in the $10^4$ cm$^{-1}$ to $10^5$ cm$^{-1}$ range and each impinging photon can create a pair of photocarriers; that is, an electron and a hole.

The semiconductor in the base layer 18 can be substantially lattice-matched or pseudomorphic to the substrate 24. Epitaxial layers that do not have strain-induced defects are often called pseudomorphic layers. Pseudomorphic heterostructures can contain strained layers but only to the extent that elastic deformations are able to accommodate that strain such that no defects are generated by excess stresses or strains in the device. That is the lattice constant of the semiconductor used for the base layer 18 or the base segments 130, 132, 134, 136, and 138 is preferably substantially the same as the lattice constant of the substrate 24. Lattice-matched layers help assure good crystal quality, low defect densities, long minority carrier lifetimes, low parasitic currents, low dopant diffusion, low alloy diffusion, low shunting, and therefore higher transducer performance. Alternatively, the base layer 18 can be metamorphic and therefore have a lattice-mismatched to the substrate 24. For metamorphic layers, the buffer 22 can be used to adjust the lattice parameter of the semiconductor layers from the lattice parameter of the substrate 24 to the desired lattice constant value for the base 18. For metamorphic layers, the buffer 22 can be graded in composition or comprise various layers with different lattice constants to accommodate the stresses or the strains due to the lattice-mismatched.

Examples of lattice-matched or pseudomorphic semiconductors that can be used for the base layer 18 or the base segments 130, 132, 134, 136, and 138 for embodiments comprising a GaAs substrate 24 include: binary GaAs, AlAs, or ZnSe; or ternary $Al_xGa_{(1-x)}As$, $In_xGa_{(1-x)}P$, $Al_xGa_{(1-x)}P$; or quaternary InGaAsP, GaInNAs. As will be understood by a worker skilled in the art, other alloys can also be used such as: group IV semiconductors: Ge, SiGe; other III-V alloys of AlGaInNPAsSb; other II-VI alloys of ZnCdMnMgOSSeTe, or combinations of the above. Other embodiments can incorporate nanostructures to enhance the optical properties, electronic properties, and/or material properties. For example the base 18 could comprise layers of semiconductor quantum wells, quantum wires, or quantum dots.

Examples of lattice-matched or pseudomorphic semiconductors that can be used for the base layer 18 or the base segments 130, 132, 134, 136, and 138 for embodiments comprising a Ge substrate 24 include: latticed-matched Ge, $In_xGa_{(1-x)}As$, InAlGaAs, $In_xGa_{(1-x)}P$, $Al_xGa_{(1-x)}P$; or binary GaAs, AlAs, or ZnSe; or ternary $Al_xGa_{(1-x)}As$; or quaternary InGaAsP, GaInNAs. As will be understood by a worker skilled in the art, other alloys can also be used such as: group IV semiconductors: Ge, SiGe; other III-V alloys of AlGaInNPAsSb; other II-VI alloys of ZnCdMnMgOSSeTe. Other embodiments can incorporate nanostructures to enhance the optical properties, electronic properties, and/or material properties. For example the base 18 could comprise layers of semiconductor quantum wells, quantum wires, or quantum dots.

Examples of lattice-matched or pseudomorphic semiconductors that can be used for the base layer 18 or the base segments 130, 132, 134, 136, and 138 for embodiments comprising a InP substrate 24 include: latticed-matched InP, $In_xGa_{(1-x)}As$, $In_xAl_{(1-x)}As$, $In_xGa_{(1-x)}P_yAs_{(1-y)}$, $GaAs_ySb_{(1-y)}$, $Zn_xCd_{(1-x)}Se$, $ZnSe_yTe_{(1-y)}$; or GaInNAs. As will be understood by a worker skilled in the art, other alloys can also be used alone or combined together comprising: Ge, SiGe; other III-V alloys of AlGaInNPAsSb; other II-VI alloys of ZnCdMnMgOSSeTe. Other embodiments can incorporate nanostructures to enhance the optical properties, electronic properties, and/or material properties. For example the base 18 can comprise layers of semiconductor quantum wells, quantum wires, or quantum dots.

Examples of lattice-matched or pseudomorphic semiconductors that can be used for the base layer 18 or the base segments 130, 132, 134, 136, and 138 for embodiments comprising a Si substrate 24 include: latticed-matched Si, GaP, AlP, $Al_xGa_{(1-x)}P$, ZnS, GaPN, AlPN, $Al_xGa_{(1-x)}PN$. As will be understood by a worker skilled in the art, other alloys can also be used alone or combined together comprising: Ge, SiGe; other III-V alloys of AlGaInNPAsSb; other II-VI alloys of ZnCdMnMgOSSeTe. Other embodiments can incorporate nanostructures to enhance the optical properties, electronic properties, and/or material properties. For example the base 18 can comprise layers of semiconductor quantum wells, quantum wires, or quantum dots.

Examples of lattice-matched or pseudomorphic semiconductors that can be used for the base layer 18 or the base segments 130, 132, 134, 136, and 138 for embodiments comprising a GaN, a SiC, or a Sapphire substrate 24 include: latticed-matched GaN, or AlInN. As will be understood by a worker skilled in the art, other alloys can also be used alone or combined together comprising: ZnO, or other III-V alloys of AlGaInNPAsSb; other II-VI alloys of ZnCdMnMgOSSeTe. Other embodiments can incorporate nanostructures to enhance the optical properties, electronic properties, and/or material properties. For example the base 18 could comprise layers of semiconductor quantum wells, quantum wires, or quantum dots.

Examples of lattice-matched or pseudomorphic semiconductors that can be used for the base layer 18 or the base segments 130, 132, 134, 136, and 138 for embodiments comprising a InAs or GaSb substrate 24 include: latticed-matched InAs, GaSb, CdSe, AlSb, InPSb, ZnTe, CdSTe, CdSeTe, MnSeTe. As will be understood by a worker skilled in the art, other alloys can also be used alone or combined together comprising: other III-V alloys of AlGaInNPAsSb; other II-VI alloys of ZnCdMnMgOSSeTe. Other embodiments can incorporate nanostructures to enhance the optical properties, electronic properties, and/or material properties. For example the base 18 could comprise layers of semiconductor quantum wells, quantum wires, or quantum dots.

Examples of lattice-matched or pseudomorphic semiconductors that can be used for the base layer 18 or the base segments 130, 132, 134, 136, and 138 for embodiments comprising a CdTe or InSb substrate 24 include: latticed-matched CdTe or InSb. As will be understood by a worker skilled in the art, other alloys can also be used alone or combined together comprising: other III-V alloys of AlGaInNPAsSb; other II-VI alloys of ZnCdMnMgOSSeTe. Other embodiments can incorporate nanostructures to enhance the optical properties, electronic properties, and/or material properties. For example the base 18 could comprise layers of semiconductor quantum wells, quantum wires, or quantum dots.

FIG. 2 exemplifies an embodiment of a transducer in accordance with the present disclosure where GaAs or Ge is used for the substrate 24. The substrate is p-type to have the same conductivity as the base 18 which is also preferably p type. The base layer 18 can be GaAs, or can include a fraction x of Al using an $Al_xGa_{(1-x)}As$ to optimize the photo-transducer's performance according to the wavelength of the optical input 100. The thickness of the base layer is between 1 and 10 microns, or between 2 and 5 microns, or between 3 and 4 microns. A back surface field 20 made of p-type GaInP provides a good minority carrier reflector for the minority electron photo-generated in the base 18 by the optical input 100. The thickness of the back surface field is between 10 nm and 2 microns, or between 20 nm and 500 nm, or between 80 and 120 nm. A buffer layer 22 is optional but can be used to insure that the epilayer surface and/or the growth conditions are optimized before the growth of the optically active layers atop the substrate and buffer layers. The buffer layer 22 can be p-type GaAs or p-type GaInP. The thickness of the buffer is between 10 nm and 10 microns, or between 100 nm and 2000 nm, or between 200 and 500 nm. The emitter 16 can be n-type GaAs, or can include a fraction x of Al using an n-type $Al_xGa_{(1-x)}As$ to optimize the photo-transducer's performance according to the wavelength of the optical input 100. Alternatively an n-type GaInP can also be used for the emitter layer 16. The thickness of the emitter layer 16 can be between 10 nm and 1000 nm, or between 20 nm and 200 nm, or between 80 and 120 nm.

A passivating window 14 (which can also be called a passivation window, or simply a window layer) made of n-type GaInP or AlInP provides a good minority carrier reflector for the minority holes photo-generated in the emitter 16 by the optical input 100. The window layer can comprise a number of layers with different values of doping and bandgap energies to optimize the optoelectronic properties of the photo-transducer. The window layer can be adjacent to, and in electrical contact with the emitter layer and the contact layer. The window layer can also play other functions in the device to improve the crystal quality, to optimize the photon absorption and photo-carrier extraction, and/or to transition the growth process from one section of layers to another. The doping in the window layers can also be increased to minimize resistive losses due to the current flowing from and into the emitter of the top junction 16 to the top n-type ohmic metal contact 10. The thickness of the window can be between 10 nm and 5 microns, or between 20 nm and 2000 nm, or between 30 and 1000 nm. The window layer can be transparent to the optical input 100. Alternatively the window composition could also be $Al_xGa_{(1-x)}As$ with an Al composition x such that the band gap of the window is greater than the energy of the photons from the optical input 100 and also greater than the bandgap of the emitter 14. The window can also be divided into 2 sections: a first section adjacent to the emitter having a lower bandgap than the second section adjacent to the front surface 102 and/or the contact layer 12. For example, the first section of the window can be made of GaInP and the second section can be made of AlInP.

The ratio of the thickness of the first section over the total thickness of the window can be between 10% and 90%. The window layer can also be a stop-etch in the fabrication process of the photo-transducer. For example a wet-etch solution can be chosen to stop on a layer containing a certain concentration of Al, or P, and the design of the layer composition can therefore take into considerations such elements which would facilitate the fabrication processes.

A contact layer 12 can be made of n-type GaAs. The doping level in the contact layer is made high enough to insure a good ohmic contact with a low resistivity with the metal layer 10 deposited atop the contact layer 12. The doping level of the contact layer 12 can be comprised between $5\times10^{17}$ cm$^{-3}$ and $5\times10^{20}$ cm$^{-3}$, or between $10^{18}$ cm$^{-3}$ and $10^{19}$ cm$^{-3}$. The thickness of the contact layer 12 can be comprised between 100 nm and 5000 nm, or between 20 nm and 1000 nm, or between 30 and 500 nm.

The embodiment exemplified in FIG. 2 and described herein gives an example of a n on p configuration, but a worker skilled in the art would recognize that a p on n configuration would give equivalent features and is also within the scope of the present disclosure. For a p on n configuration the doping types are reverse, for example the base 18 would be doped n-type and the emitter would be doped p type, etc.

The doping level for the base layer 18 or the base segments 130, 132, 134, 136, and 138 can be between $5\times10^{15}$ cm$^{-3}$ and $10^{19}$ cm$^{-3}$, or between $5\times10^{16}$ cm$^{-3}$ and 8 E18 cm$^{-3}$, or between $5\times10^{17}$ cm$^{-3}$ and $5\times10^{18}$ cm$^{-3}$. The doping level for the emitter layer 16 can be comprised between $10^{16}$ cm$^{-3}$ and $5\times10^{19}$ cm$^{-3}$, or between $10^{17}$ cm$^{-3}$ and $10^{19}$ cm$^{-3}$, or between $5\times10^{17}$ cm$^{-3}$ and $5\times10^{18}$ cm$^{-3}$. The doping level for the window layer 14 can be comprised between $10^{17}$ cm$^{-3}$ and $10^{20}$ cm$^{-3}$, or between $5\times10^{17}$ cm$^{-3}$ and $5\times10^{19}$ cm$^{-3}$, or between $10^{18}$ cm$^{-3}$ and $10^{19}$ cm$^{-3}$. The doping level for the back surface field layer 20 can be comprised between $10^{17}$ cm$^{-3}$ and $10^{20}$ cm$^{-3}$, or between $5\times10^{17}$ cm$^{-3}$ and $5\times10^{19}$ cm$^{-3}$, or between $10^{18}$ cm$^{-3}$ and $10^{19}$ cm$^{-3}$.

As mentioned above, the connecting elements separate the base 18, into multiple base segments, each of can absorb substantially the same fraction of the optical input, and the connecting elements electrically connect adjacent base segments to each other. The connecting elements can be made of metal layers, or transparent conducting oxides layers, or tunnel junction layers, or doped semiconductor layers. The connecting elements may include a semiconductor layer that is doped oppositely to how the semiconductor base layers are doped. That is, the connecting elements may include a semiconductor layer that is n-doped when the semiconductor base layers are p-doped and, the connecting elements may include a semiconductor layer that is p-doped when the semiconductor base layers are n-doped. The various base segments can be mechanically stacked and disposed between the connecting elements or grown on top of each other while being intercalated between the connecting elements. To facilitate the transmission of the optical input from one base segment to the others, and also to facilitate the fabrication process and the quality of the semiconductor materials in the various base segments, it can be advantageous to grow all the base segments and the connecting elements using a continuous epitaxial process. Using different bandgap energy semiconductor materials for the connecting elements as illustrated in FIG. 7 can also be beneficial. It may also be desirable to optimize the doping level and doping type of the various semiconductor layers comprised in the connecting element in order to facilitate the current flow, to optimize the photo-carrier (electron and hole) extraction in presence of the connecting elements, and to allow the photovoltages and photocurrents of the various base segments to be connected. The current flow can comprise the flow of majority carriers or minority carriers within the valence bands or the conduction bands of the transducer, the tunneling of carriers from a conduction band to a valence band or from a valence band to a conduction band, the conversion of minority carriers into majority carriers using p-n junctions, the defect, trap, or mini-band assisted carrier transport, or any combination with other suitable current flows.

For an embodiment in which the base 18 is GaAs, for example p-type GaAs as shown in FIG. 2: layer 302 can be GaInP, AlGaInP, AlAs or AlGaAs with a composition chosen to give a band gap greater than the energy of the photons of the optical input, and the p-type doping level for layer 302 can be comprised between $10^{17}$ cm$^{-3}$ and $10^{20}$ cm$^{-3}$, or between $5\times10^{17}$ cm$^{-3}$ and $5\times10^{19}$ cm$^{-3}$, or between $1\times10^{18}$ cm$^{-3}$ and $10^{19}$ cm$^{-3}$. The thickness of the layer 302 can be between 10 nm and 2 microns, or between 20 nm and 500 nm, or between 80 nm and 120 nm. Layer 304 can be made of GaInP, AlGaAs, AlAs or AlInP with a composition chosen to give a bandgap energy greater than the energy of the photons of the optical input, and the p-type doping level for layer 304 can be comprised between $10^{18}$ cm$^{-3}$ and $10^{21}$ cm$^{-3}$, or between $5\times10^{18}$ cm$^{-3}$ and $5\times10^{20}$ cm$^{-3}$, or between $7\times10^{18}$ cm$^{-3}$ and $5\times10^{20}$ cm$^{-3}$. The thickness of layer 304 can be comprised between 5 nm and 2 microns, or between 10 nm and 500 nm, or between 20 and 200 nm. Layer 306 can be made of GaInP, AlGaAs, AlAs or AlInP with a composition chosen to give a bandgap energy greater than the energy of the photons of the optical input, and the n-type doping level for layer 306 can be comprised between $10^{18}$ cm$^{-3}$ and $10^{21}$ cm$^{-3}$, or between $5\times10^{18}$ cm$^{-3}$ and $5\times10^{20}$ cm$^{-3}$, or between $7\times10^{18}$ cm$^{-3}$ and $5\times10^{20}$ cm$^{-3}$. The thickness of layer 306 can be comprised between 5 nm and 2 microns, or between 10 nm and 500 nm, or between 20 and 200 nm. Layer 308 can be made of GaInP, AlGaAs, with a composition chosen to give a band gap Eg4 greater than the energy of the photons of the optical input, and the n-type doping level for layer 308 can be comprised between $10^{17}$ cm$^{-3}$ and $10^{20}$ cm$^{-3}$, preferably between $5\times10^{17}$ cm$^{-3}$ and $5\times10^{19}$ cm$^{-3}$, or between $10^{18}$ cm$^{-3}$ and $10^{19}$ cm$^{-3}$. The thickness of layer 308 can be comprised between 10 nm and 2 microns, or between 20 nm and 500 nm, or between 80 nm and 120 nm. Layer 310 can comprise GaAs, GaInP, or AlGaAs, with a composition chosen to give a bandgap energy Eg5 equal or greater than the energy of the photons of the optical input, and the n-type doping level for layer 310 can be comprised between $10^{16}$ cm$^{-3}$ and $5\times10^{19}$ cm$^{-3}$, or between $10^{17}$ cm$^{-3}$ and $10^{19}$ cm$^{-3}$, or between $5\times10^{17}$ cm$^{-3}$ and $5\times10^{18}$ cm$^{-3}$. The thickness of layer 310 can be comprised between 10 nm and 1000 nm, or between 20 nm and 200 nm, or between 80 nm and 120 nm.

For the case for which the base 18 is InP, or InGaAsP with a lattice constant similar to the one of InP, or InGaAs with a lattice constant similar to the one of InP, for example, p-type InP, p-type InGaAs, or p-type InGaAsP, the layer 302 can be made of InP, AlInAs, GaInAsP, or AlGaInP, with a composition chosen to give a bandgap Eg1 greater than the energy of the photons of the optical input, and the p-type doping level for layer 302 is between $10^{17}$ cm$^{-3}$ and $10^{20}$ cm$^{-3}$, or between $5\times10^{17}$ cm$^{-3}$ and $5\times10^{19}$ cm$^{-3}$, or between $10^{18}$ cm$^{-3}$ and $10^{19}$ cm$^{-3}$. The thickness of layer 302 can be comprised between 10 nm and 2 microns, or between 20 nm and 500 nm, or between 80 nm and 120 nm. Layer 304 can be made of InP, AlInAs, GaInAsP, or AlGaInP, with a composition chosen to give a bandgap energy Eg2 greater than the energy of the photons of the optical input, and the p-type doping level for layer 304 can be comprised between $10^{18}$ cm$^{-3}$ and $10^{21}$ cm$^{-3}$, or between $5\times10^{18}$ cm$^{-3}$ and $5\times10^{20}$ cm$^{-3}$, or between $7\times10^{18}$ cm$^{-3}$ and $5\times10^{20}$ cm$^{-3}$. The thickness of the layer 304 can be comprised between 5 nm and 2 microns, or between 10 nm and 500 nm, or between 20 nm and 200 nm. Layer 306 can be made of InP, AlInAs, GaInAsP, or AlGaInP, with a composition chosen to give a bandgap energy Eg3 greater than the energy of the photons of the optical input, and the n-type doping level for layer 306 can be comprised between $10^{18}$ cm$^{-3}$ and $10^{21}$ cm$^{-3}$, or between $5\times10^{18}$ cm$^{-3}$ and $5\times10^{20}$ cm$^{-3}$, or between $7\times10^{18}$ cm$^{-3}$ and $5\times10^{20}$ cm$^{-3}$. The thickness of layer 306 can be comprised between 5 nm and 2 microns, or between 10 nm and 500 nm, or between 20 nm and 200 nm. Layer 308 can be made of InP, AlInAs, GaInAsP, or AlGaInP, with a composition chosen to give a bandgap energy Eg4 greater than the energy of the photons of the optical input, and the n-type doping level for layer 308 can be comprised between $10^{17}$ cm$^{-3}$ and $10^{20}$ cm$^{-3}$, or between $5\times10^{17}$ cm$^{-3}$ and $5\times10^{19}$ cm$^{-3}$, or between $10^{18}$ cm$^{-3}$ and $10^{19}$ cm$^{-3}$. The thickness of layer 308 can be comprised between 10 nm and 2 microns, or between 20 nm and 500 nm, or between 80 nm and 120 nm. Layer 310 can be made of InGaAs, InP, AlInAs, GaInAsP, or AlGaInP, with a composition chosen to give a bandgap energy Eg5 equal or greater than the energy of the photons of the optical input, and the n-type doping level for layer 310 can be comprised between $10^{16}$ cm$^{-3}$ and $5\times10^{19}$ cm$^{-3}$, or between $10^{17}$ cm$^{-3}$ and $10^{19}$ cm$^{-3}$, or between $5\times10^{17}$ cm$^{-3}$ and $5\times10^{18}$ cm$^{-3}$. The thickness of layer 310 can be comprised between 10 nm and 1000 nm, or between 20 nm and 200 nm, or between 80 nm and 120 nm.

The connecting elements 300 as illustrated in FIG. 7 are disposed within the base 18 as illustrated in FIG. 2 at specific distances from the emitter. As mentioned above, these distances depend on the wavelength of the optical input 100 and on the absorption coefficient of the base material 18. A worker skilled in the art will recognize that there are many possible combinations of optical wavelengths and base materials which can be used to satisfy different applications. To exemplify an embodiment of the disclosure, the description below details example positions of the connecting elements for a photo-transducer of the present disclosure using an optical input 100 with a wavelength of 830 nm. The semiconductor material for the base layer is chosen to have a bandgap energy smaller than the energy of the photons of the optical input 100. The bandgap energy can be between 500 meV and 0 meV smaller than the energy of the photons of the optical input 100. In other embodiments, the bandgap energy can be between 200 meV and 10 meV smaller than the energy of the photons of the optical input 100. Yet in other embodiments, it might be desirable to design the photo-transducer with the bandgap energy to be slightly larger than the energy of the photons of the optical input 100 in the case for which the semiconductor material has residual absorption below the bandgap energy. For a wavelength of 830 nm, the photon energy is 1.494 eV, therefore the base semiconductor material can be chosen to be preferably GaAs, or Al$_x$Ga$_{(1-x)}$As with x comprised between 0% and 5%. If a p-type GaAs base is chosen as illustrated in FIG. 2 with a thickness 120 of t=4 microns, then the absorption coefficient α for GaAs at the optical input wavelength of 830 nm is approximately $1.2\times10^4$ cm$^{-1}$. Therefore based on the formula for the absorption $I(z)=I_o\exp(-az)$ it is straightforward to calculate that the value for the position of the connecting elements of d1=192 nm, d2=438 nm, d3=784 nm, and d4=1365 nm will divide the base into 5 segments, s1, s2, s3, s4, and s5, each absorbing 19.8% of the optical input light.

A semiconductor material with a bandgap energy larger than the optical input can be selected for the emitter 16, for example Al$_x$Ga$_{(1-x)}$As with x between 10% and 35% or InGaP. Alternatively, GaAs can also be selected for the emitter 16, but then the value of the thickness of the GaAs emitter layer 16 has to be subtracted from the above values of d1 to d5 because the optical input 100 will also be absorbed in the emitter layer 16. Similarly, for the layer 310 with Eg5 of the connecting layers c1, c2, c3, and c4 of this embodiment, a semiconductor material with a bandgap larger than the optical input can be selected for the layers 310, for example Al$_x$Ga$_{(1-x)}$As with x between 10% and 35% or InGaP. Alternatively, GaAs can also be selected for the layers 310, but then the value of the thickness of the GaAs layer 310 has to be subtracted in the calculations of the above values of d1 to d5 because the optical input 100 will also be absorbed in the layers 310. The other layers 302, 304, 306, 308 of the connecting elements 300 are all selected from a group of semiconductor material with a bandgap larger than the optical input such as for example Al$_x$Ga$_{(1-x)}$As with x between 10% and 100%, InGaP, or AlInP. In addition to the above, graded index inhomogeneous dielectrics which can be fabricated for examples using oblique angle deposition or PECVD plasma techniques can also provide good anti-reflective coatings by themselves or can be used as part of a stack of layers. In all of the above the thickness(es) of the anti-reflection layer(s) can be estimated or calculated using multiple reflections algorithms but in general the layers' thickness will be a fraction of the wavelengths of interests namely between 5 nm and 200 nm depending on the designs and number of layers used.

As will be understood by the skilled worker, the exposed portion of the window layer 14, or a portion of the front surface 102 having had the contact layer 12 removed cap therefrom (the light-input portion of the front surface 102) can be covered by an antireflection coating made of any suitable material such as, for example, TiO$_2$, Al$_2$O$_3$, SiO$_2$, Sb$_2$O$_5$, Ta$_2$O$_5$, SiN$_x$, MgF$_2$, ZnSe, ZnS, zirconium oxide, zirconium dioxide or Indium-Tin-Oxide layers, or any other suitable combination of two or more of these layers, or similar dielectric layers, typically chosen with a combination of index of refraction that tend to minimize the reflections over the wavelength range of interest by essentially providing progressive steps in the index of refraction when going from the photo-transducer window 14 to the surrounding medium which is typically air, an encapsulant medium, beam shaping optics or a combination of the above used to guide the optical input into the photo-transducer and further protect its front surface 102 or other sensitive layers. A bi-layer combining a low index of refraction and a high index of refraction from a choice of the above dielectric typically provides good anti-reflective properties as would be known by a skilled worker. For example one of the following bi-layers can used TiO$_2$/Al$_2$O$_3$, SiO$_2$/Sb$_2$O$_5$, SiO$_2$/Ta$_2$O$_5$, Al$_2$O$_3$/Sb$_2$O$_5$, SiO$_2$/SiN$_x$, MgF$_2$/ZnSe, Al$_2$O$_3$/Ta$_2$O$_5$, MgF$_2$/ZnS, SiO$_2$/TiO$_2$, or Indium-Tin-Oxide layers combined with some of the above dielectrics.

Figure 9:
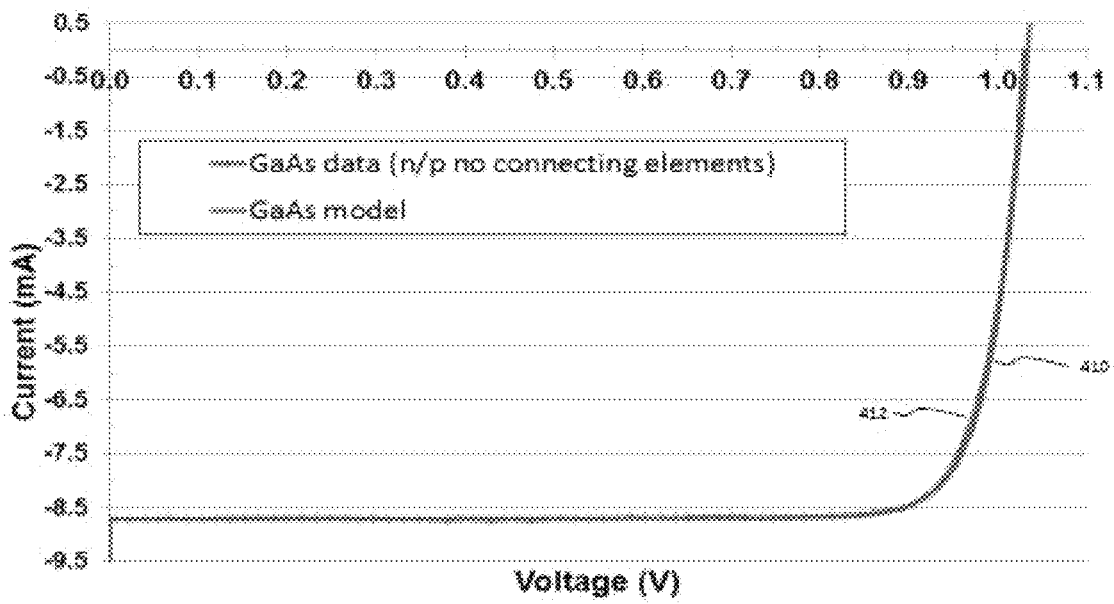
FIG. 9 is a graph of current as a function of voltage of a p-n diode having no connecting elements.

FIG. 9 shows the results for the embodiment of a transducer as illustrated in FIG. 2, comprising a base 18 using a p-type GaAs, with the thickness 120 of 3.5 microns, but comprising no connecting elements in the base 18. An example of data of an I-V measurement is plotted in curve 410 for a device temperature of 25 C. The I-V curve 410 is obtained for an illumination intensity of 1366 W/m$^2$, with an embodiment incorporating GaAs substrate 24, a GaAs buffer layer 22, a GaInP back surface field 20, a n-type GaAs emitter 16, a GaInP window 14, a dual layer antireflection coating deposited on the front surface 102, and patterned contact and metal layers 12 and 10 to extract the photocurrent and photovoltage from the photo-transducer. The I-V measurement is taken between the top metal 10 and a metal contact applied to the substrate 24. The measured I-V data is modelled using the diode equation $I(V)=I_{ill}-I_o [\exp(eV/nkT)-1]$, where $I(V)$ is the diode current at the applied voltage V, Iill is the current from the illumination, Io is the saturation current of the photodiode, V is the applied voltage, n is the photodiode ideality factor (which can also be called the n-factor), k is the Boltzmann constant, and T is the temperature (here 25° C.). The diode parameters can be extracted from the measured data obtained on such a GaAs photo-transducer. These diode parameters can then be used to model photo-transducers of the embodiments incorporating connecting elements but otherwise based using the same type of materials and device growth and fabrication conditions. For example curve 412 in FIG. 9 shows that the model fits well the experimental data when using a saturation current Io ~8.8 E-12 mA/cm$^2$, and a n-factor ~1.45. These diode parameters give for the curves 412 or 410 of FIG. 4: Voc ~1.03V, a FF ~84.6%.

Figure 10:
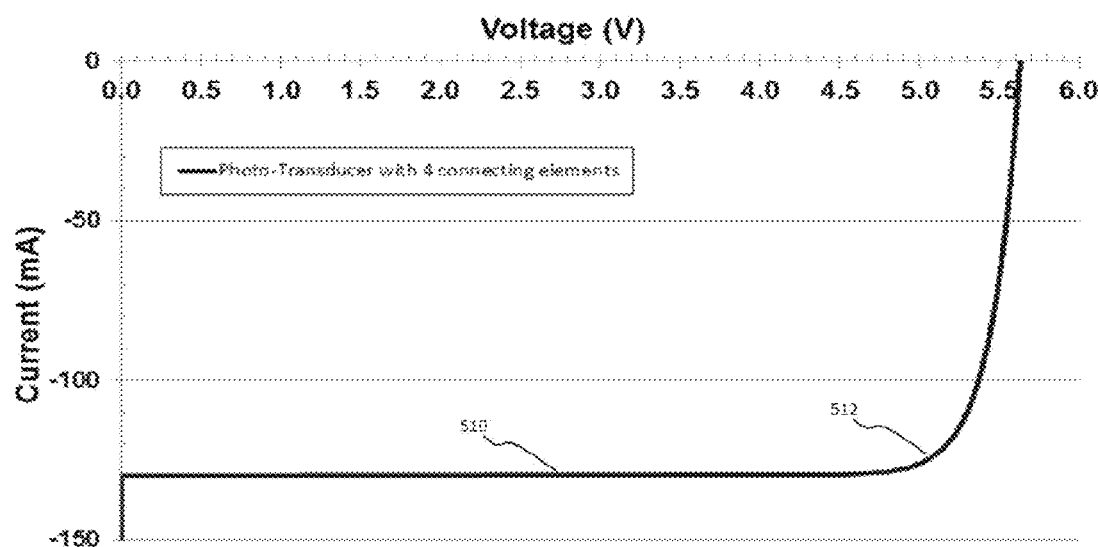
FIG. 10 is a graph of current as a function of voltage for an embodiment of a transducer in accordance with the present disclosure.

The device parameters extracted from FIG. 9 are then applied to model a photo-transducer incorporating 4 connecting elements as depicted in FIG. 2 and described herein, and to predict the performance of that photo-transducer under various conditions. For example, FIG. 10 shows such an I-V curve for a photo-transducer with a base 18 of thickness t ~4.0 microns incorporating 5 GaAs base segments s1, s2, s3, s4, and s 5 which would each absorbed 19.8% of an optical input 100 impinging the front surface 102 with a wavelength of 830 nm. The detailed requirements of the various layers for this embodiment have been described above. The I-V curve 510 of FIG. 10 is produced for an optical input of 1 Watt/cm$^2$, for a photo-transducer having a quantum efficiency of 97% at 830 nm. The I-V curve 510 has its maximum power point near the knee of the curve 512 and the analysis of the I-V yields the following performance metrics: Voc ~5.632V, Isc ~130 mA/cm$^2$, FF ~86.1%, FFv ~89.2%, FFi ~96.6%, Vmax ~5.022V, Imax ~125.4 mA/cm$^2$, Pmax ~630 mW/cm2, and with a conversion efficiency of Eff ~63%.

The deposition or the growth of the various semiconductor layers described in the embodiments presented and described in relation to FIG. 2 and FIG. 7 can be carried out through any suitable means of semiconductor growth such as: metal organic chemical vapor deposition (MOCVD), chemical beam epitaxy (CBE), molecular beam epitaxy (MBE), solid phase epitaxy (SPE), hydride vapour phase epitaxy or by other similar hybrid systems or combinations thereof. The growth parameters can be optimized for the various layers of the embodiments, for example to maximize the device performance or its manufacturability. The growth parameters and growth conditions that can be optimized include, for example, the growth temperature, the pressure of the various gases used to grow the layers, the ratio of those pressures (for example the III/V ratio when growing III-V semiconductor layers), the alloy composition, the residual strain, the growth rate, the doping or co-doping of the various layers, the use of surfactant gases, the use of annealing cycles, etc.

The epitaxy of such layer can be done in a process using a single wafer or multiple wafers per run. Each wafer can between 25 mm and 450 mm in diameter depending on the type of substrates used and their commercial availability. The off-cut angle of the substrate, which can also be called the misalignment angle of the substrate, can also affect the growth conditions and the quality of the layers and can therefore be adjusted to optimize the device performance. For example, the growth can be done on (100), (110), or other surfaces, and off-cut angles toward various crystallographic planes can be used with angles varying between 0 degree and 40 degrees. The typical precision and control over the thickness, the composition, and the doping of the semiconductor layers grown using the above epitaxy techniques are typically well within tolerable variations of the specifications to achieve the desired embodiments as described in the present disclosure.

Furthermore, the quality of the layers of the various embodiments, and the quality of the semiconductor material comprised in these layers, can be determined by probing, post-growth, the optical properties, electronic properties, or both, of the arrangement such as the layers shown in FIG. 2. This can be achieved by measuring the optical spectral response (quantum efficiency) of the photocurrent (PC) or photovoltage (PV), photoluminescence (PL), electroluminescence (EL), time-resolved photoluminescence (TRPL), time-resolved photo-current (TRPC), electron-beam induced current (EBIC) measurements, or other characterization techniques as described in the present disclosure or other techniques known to one skilled in the art. The characterization can be performed on calibration or validation growth runs, or on the entire heterostructure, or on some of the layers comprised within the photo-transducer, or with completed devices, including the connecting layers of FIG. 7. Such techniques can be used to determine the minority carrier lifetimes, the thicknesses of the layers, the optical paths of the layers, and other optoelectronic properties relevant to the device performance. It can also be used to reveal and/or assess for example the dependence of the photo-transducer performance on the number of connecting layers (c1, c2, c3, c4, etc) and the position of those connecting layers (d1, d2, d3, d4, etc). Furthermore, reflection high energy electron diffraction (RHEED) and optical reflectance of the transducer of FIG. 2 for example, can also be used to obtain surface roughness and morphology information of the various layers during or after the growth of the layers of FIG. 2 or FIG. 7. Such in-situ techniques and other optical techniques can be used to give a real-time feedback on the optical properties of the layers and/or on the morphology as it progresses, and can be used to determine the quality of the layers. The in-situ techniques include reflection of photon (light) or electron beams during epitaxial growth of the arrangement of FIG. 2 for example. These techniques can also provide a measurement of the curvature of the semiconductor wafer to evaluate if there are any strain build-up or strain-relaxation events occurring during the epitaxial growth. Growth conditions/parameters can be adapted as a function of the in-situ monitoring to compensate for any undesired effects observed during growth. For example, optical probing can be performed by monitoring the reflection of an optical beam using a probe beam with similar wavelength as the optical input 100 to be used for the application of interest. Alternatively, the optical probing can be done using a wavelength that takes into consideration the different index of refraction of the semiconductor layers at the growth temperature during the epitaxy. The target parameters for the various layers can then be adjusted during the growth to achieve the desired target values for the thickness of the various based segments (s1, s2, s3, s4, etc) as monitored using such in-situ techniques.

Figure 11:
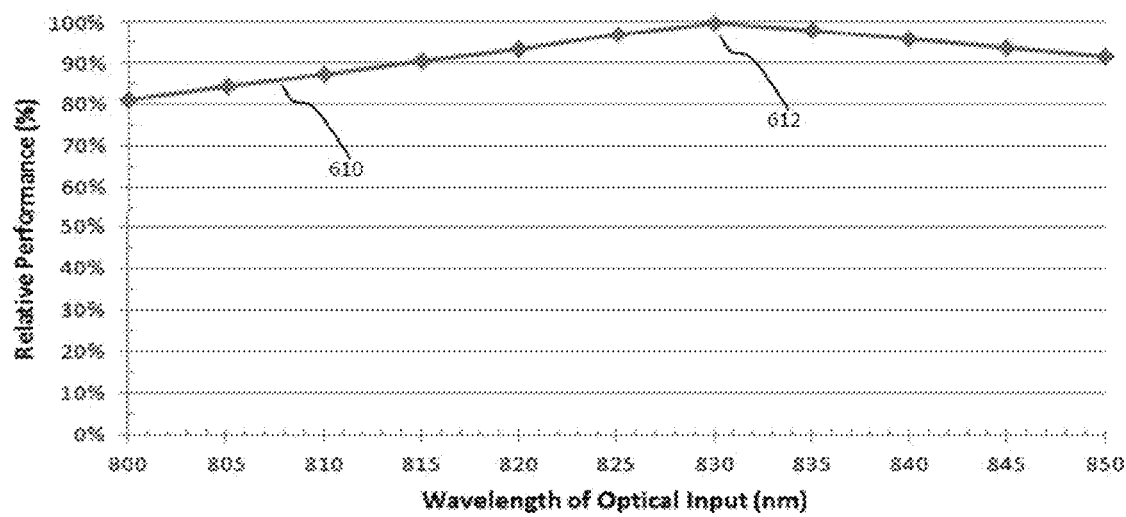
FIG. 11 shows expected performance variations for an embodiment of a transducer according to the present disclosure when the wavelength of the optical input is varied from an optimum value.

FIG. 11 shows the expected performance variations of a photo-transducer according to the present disclosure when the wavelength of the optical input is varied from the optimum design value. Plot 610 of FIG. 11 displays, for various optical input wavelengths, the relative performance of a photo-transducer with four connecting elements as illustrated and described in FIG. 2. The photo-transducer of FIG. 11 is designed for an optical input wavelength of 830 nm. The plot 610 displays a performance maximum 612 at an optical input wavelength of 830 nm. At an optical input wavelength away from the targeted 830 nm the relative performance decrease slightly, but it still exceeds 80% of the optimal performance if the optical input wavelength is changed to ~800 nm and still exceeds 90% if the optical input wavelength is changed to ~850 nm.

Figure 12:
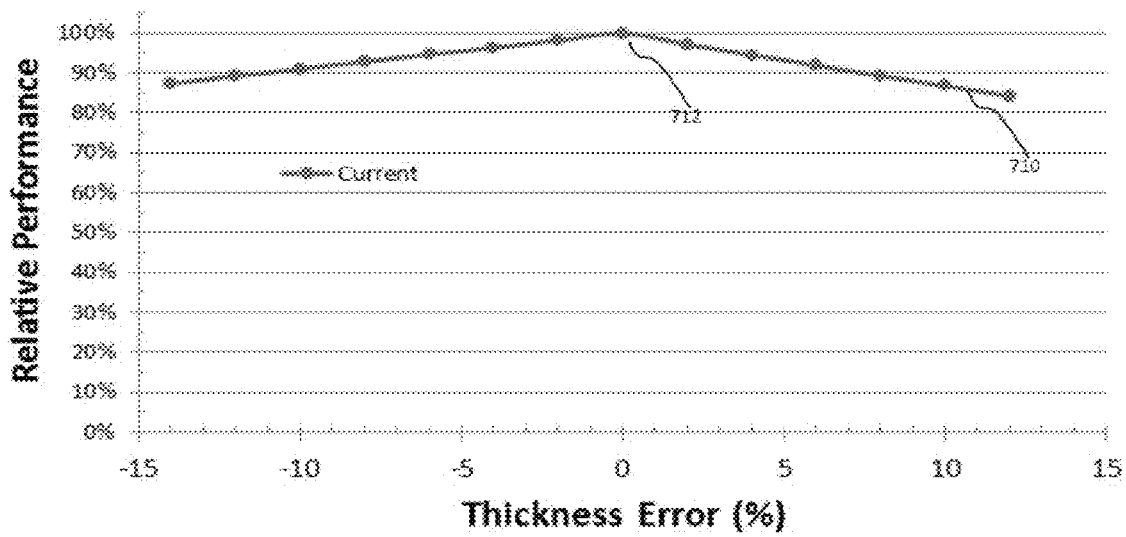
FIG. 12 shows expected performance variations of a transducer according to the present disclosure when the thicknesses of the base layer segments are varied from optimum design value.

FIG. 12 shows the expected performance variations of a photo-transducer according to the present disclosure when the thicknesses of the base layer segments are varied from the optimum design value. Such thickness variations for example could occur from variations in different regions of a wafer, or from variations from wafers to wafers within a same growth, or from wafer growth to wafer growth. Plot 710 of FIG. 12 shows, as a function of the relative thickness error, the relative performance of a photo-transducer with four connecting elements as illustrated and described in FIG. 2. The plot 710 shows a performance maximum 712 at zero thickness error (i.e. optimum design parameters as described in the above embodiments). As the thickness error is increased on either side of the optimum value (i.e. thinner layers or thicker layers) the relative performance decrease slightly, but it still exceeds 80% of the optimal performance if the magnitude of the thickness reaches 15%. Production epitaxy reactors can typically be controlled to values much better than +/−15%, and often well within only a few percents.

Figure 13:
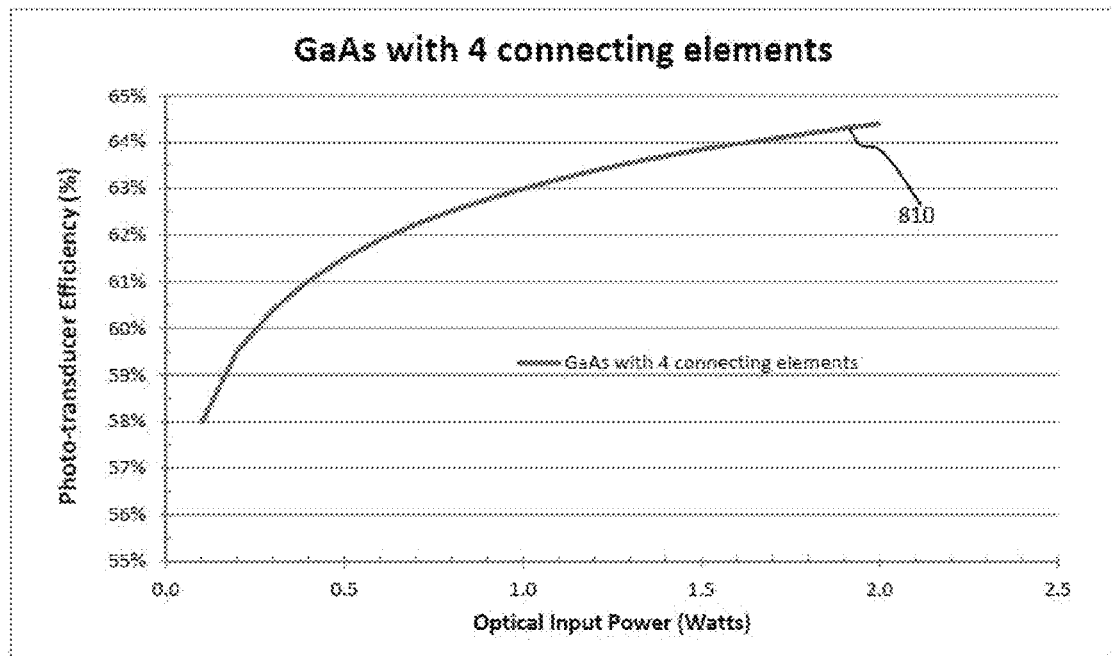
FIG. 13 shows the conversion efficiency as a function of optical input power for an embodiment of a transducer in accordance with the present disclosure.

FIG. 13 shows the photo-transducer conversion efficiency as a function of the power of the optical input 100 for a photo-transducer with four connecting elements as illustrated and described in FIG. 2. Plot 810 shows a non-linear dependence which increases for increasing powers of the optical input. At 100 mW input, the efficiency if Eff ~58% and it increases to Eff ~64.5% at about 2 W of optical input.

Figure 14:
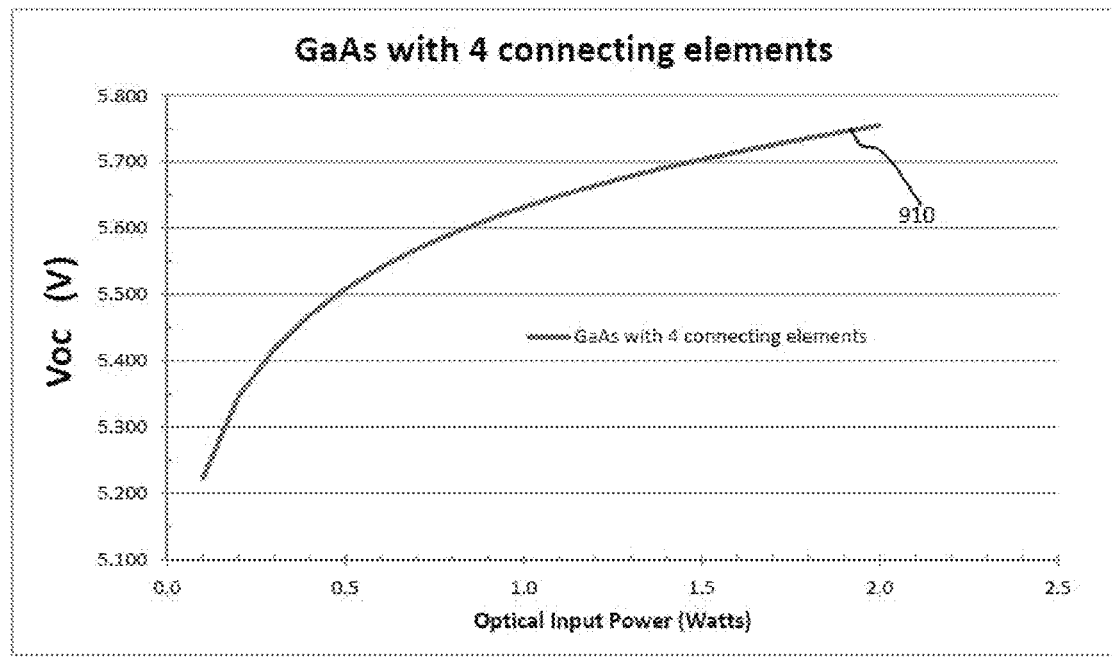
FIG. 14 shows the open circuit voltage as a function of optical input power for an embodiment of a transducer in accordance with the present disclosure.

As is shown at FIG. 14, the increase in performance observed in FIG. 13 with increasing optical input power mainly originates from the increase in photovoltage with increasing optical input power. For example, FIG. 14 plots the photo-transducer Voc as a function of the power of the optical input 100 for a photo-transducer with four connecting elements as illustrated and described in FIG. 2. Plot 910 shows a non-linear dependence, similar to FIG. 13, which increases for increasing powers of the optical input. At 100 mW input, the open circuit voltage is Voc ~5.22V and it increases to Voc ~5.76V at about 2 W of optical input.

The above embodiments exemplify the major performance parameters and photo-transducer behaviors for the material parameters which correspond to the values obtained with GaAs as measured and not necessarily optimized. One skilled in the art will realize that the performance can be further optimized through device development and manufacturing processes and with further optimization of some design parameters. For example the ideality factor for the various base segments can be optimized from the material quality and various design aspects. The latter can lead to higher values of Voc. Furthermore, the optimization of the minority carrier lifetimes would also improve the Voc values. Similarly the FF can be optimized by ensuring that the layer design is favorable to an efficient current extraction and that the sheet resistances, contact resistances, and other series resistances are minimized. The optimization of the bandgap energies used for the different semiconductors in the various layers will help minimizing the thermalization losses of the photons from the optical input absorbed by the semiconductors.

The photo-transducer of the present disclosure can be realized on a substrate which contains an active p-n (or n-p) junction capable of detecting photons in the optical input which could be at a different wavelength. That is the optical input 100 can have two sources, a first optical power source which will be converted by the base segments as described in the above embodiment, and simultaneously a secondary optical signal which will be detected by a p-n junction constructed within the substrate layer 24. The monolithically integrated photo-transducer of this embodiment can be used for example for applications which transmit simultaneously a data signal and optical power. For example, the embodiment can comprise a GaAs base layer 18 with connecting elements as illustrated in FIG. 2 to produce a photo-transducer and the embodiment can further comprise a Ge substrate that includes a p-n junction. The Ge p-n junction can be obtained by diffusion during the growth of the III-V layers on the Ge substrate, for example by diffusing group V atoms to create an n-type emitter into a p-type Ge substrate which constitute the base. The wavelength of the first optical power source preferably has a wavelength comprised between 500 nm and 880 nm, or between 750 nm and 880 nm. The wavelength of the secondary optical signal has a wavelength comprised between 1250 nm and 1700 nm, or between 1300 nm and 1650 nm. The p-n junction formed in the Ge substrate is adjacent to photo-transducer on the side opposite to the front surface. To optimize the material quality the GaAs base layer 18 in this embodiment a small fraction of about 1.1% indium can be incorporated (i.e. $In_xGa_{(1-x)}As$ with x ~1.1%) to insure the base segments and the other layers grown on the substrate remain lattice-matched to the Ge lattice constant. In such an embodiment, the transducer is electrically connected to transducer circuitry through a first set of electrical contacts and, the Ge p-n junction is electrically connected to data processing circuitry to process the data signal detected at the Ge p-n junction.

Figure 21:
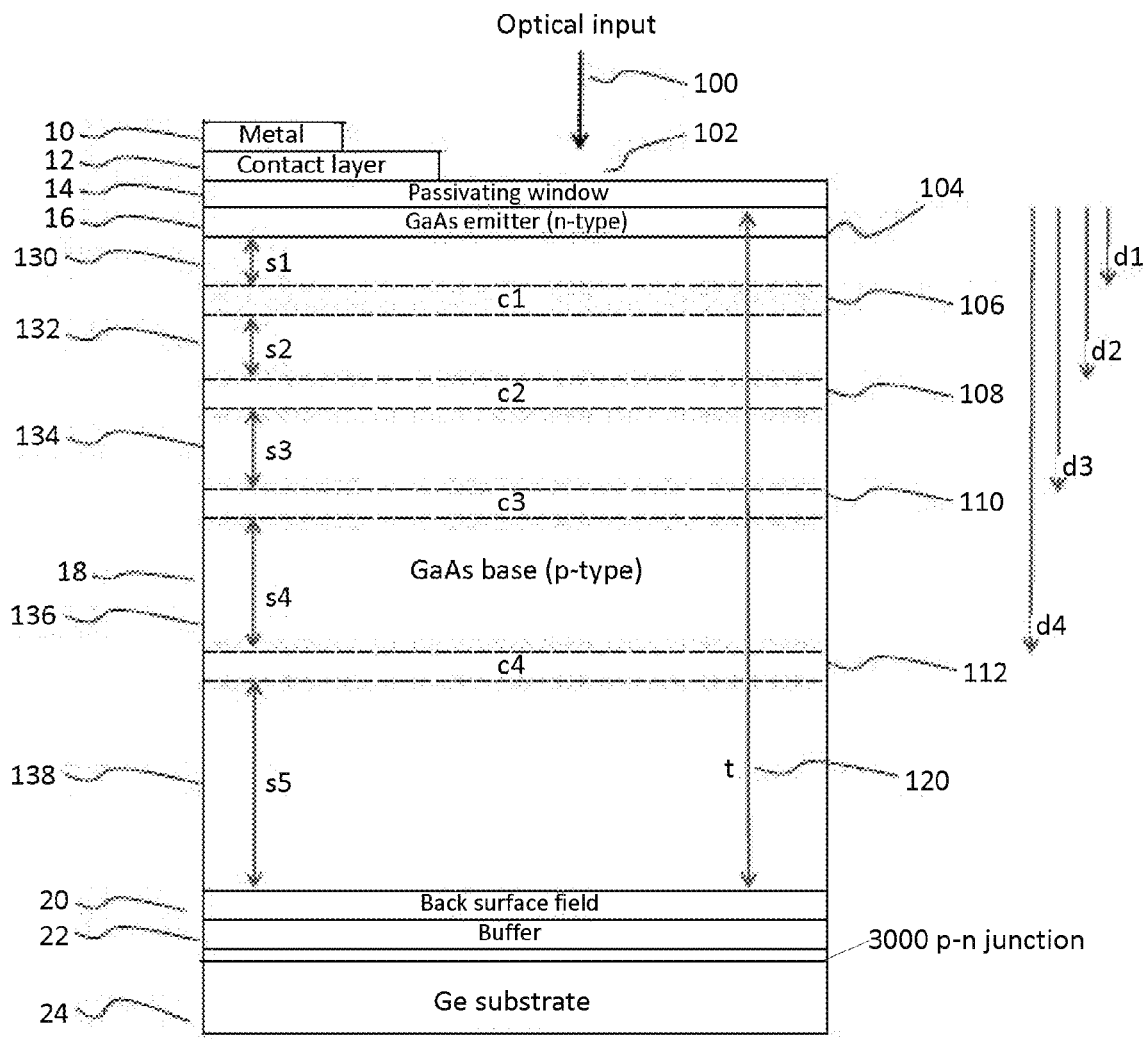
FIG. 21 shows an embodiment of a transducer and data receiver unit in accordance with the present disclosure.

FIG. 21 shows an embodiment of a transducer and data receiver unit that receives, in the optical input, optical power at a first wavelength (first energy) and a data signal at another wavelength (energy). The optical power is detected at the transducer portion, which comprises the semiconductor emitter layer 16 and at the base 18, which includes the semiconductor base layers 130, 132, 134, 136, and 138. The data signal is detected at p-n junction 3000, which is formed in the Ge substrate 24. The p-n junction 300 can be referred to as an optical signal detector.

Photo carriers (electrons and holes) generated in the transducer of the present disclosure are collected by electrical contacts. In an embodiment, where the emitter is an n-type semiconductor, electrons arrive at the emitter and then flow laterally through the emitter layer before reaching a metal electrical contact. In another embodiment, where the emitter is a p-type semiconductor, holes arrive at the emitter and then flow laterally to the metal electrical contact. In both cases, the emitter can be doped in the range of $5 \times 10^{18}$ to $2 \times 10^{20}$ in order to minimize resistive losses. Doping at too high concentrations however can reduce the carrier mobility and hence the layer conductivity as well as the minority carrier lifetime; a compromise can be made to optimize the overall performance of the transducer. Additionally, it can be advantageous that the metal electrical contact be ohmic in nature have a low resistance per square of $1 \times 10^{-5}$ ohm-cm² or lower.

In cases where the illumination area of the photo transducer is large and carriers have to travel long lateral distances to the electrical contact, typically from a few hundred microns or more, and/or where large current are generated, the resistive losses from current flowing through the emitter layer can be significant. It is common practice in these cases to use a metal electrical contact that has a metal grid line pattern designed to reduce the lateral distances travelled by the carriers and to minimize the emitter resistance. Prior art grid lines are typically between one and 15 microns wide and are separated by 50 microns or more depending on the current densities generated for a particular application. Grid lines on the other hand, will block (shadow) some of the incident light thereby reducing the total current and efficiency of the transducer. The design optimization therefore requires a careful balance between the emitter doping levels, the grid line pattern and the metal contacts.

An alternative to grid lines is to form a transparent conductive film (TCF) on the emitter layer or on the window layer. The incident light can then propagate freely through the TCF and carriers generated underneath and travelling back into the emitter can make use of the transparent electrode as a parallel path to reach the metal contact. This embodiment eliminates shadowing of the incident light from grid lines and helps to minimize the lateral resistance. The TCF, which is a transparent electrode, can be made of indium tin oxide or ITO; fluorine doped tin oxide or FTO; zinc oxide or ZnO; aluminum doped zinc oxide or AZO; indium doped cadmium oxide; binary compounds of metal oxides; organic films using carbon nanotubes and graphene; polymers such as polyacetylene, polyaniline, polypyrrole, polythiophenes; and poly(3,4-ethylenedioxythiophene) and their derivatives.

In other embodiments the transparent electrode can be made of highly doped semiconductor materials, with doping typically comprised between $10^{18}$ to $10^{20}$ $cm^{-3}$, and with a bandgap higher than the photon energy of the incident light to allow complete transmission of the incident light. The semiconductor materials in these embodiments can include III-V or II-VI compound semiconductor materials including but not restricted to the same materials listed earlier for the passivating window 14 of FIGS. 1 and 2.

Figures 15, 16, 17:
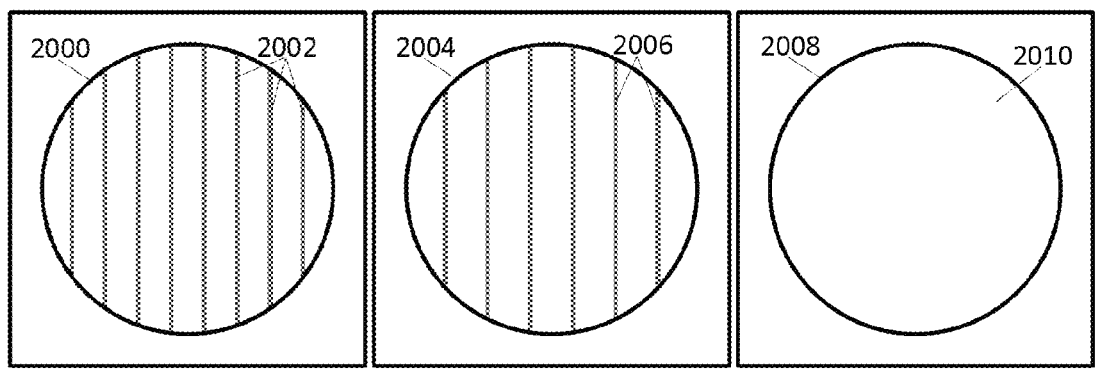
FIG. 15 shows a top view of a transducer of the present disclosure that comprises grid lines separated from each other by a distance of 325 microns.
FIG. 16 shows a top view of transducer of the present disclosure that comprises separated from each other by a distance of 425 microns.
FIG. 17 shows a top view of a transducer of the present disclosure that is free of gridlines but that comprises a transparent conductive film.

FIG. 15 shows a top view of transducer 2000 of the present disclosure that comprises grid lines 2002 separated from each other by a distance of 325 microns. FIG. 16 shows a top view of transducer 2004 of the present disclosure that comprises grid lines 2006 separated from each other by a distance of 425 microns. FIG. 17 shows a top view of a transducer 2008 of the present disclosure that is free of gridlines but that comprises a TCF 2010.

Figure 18:
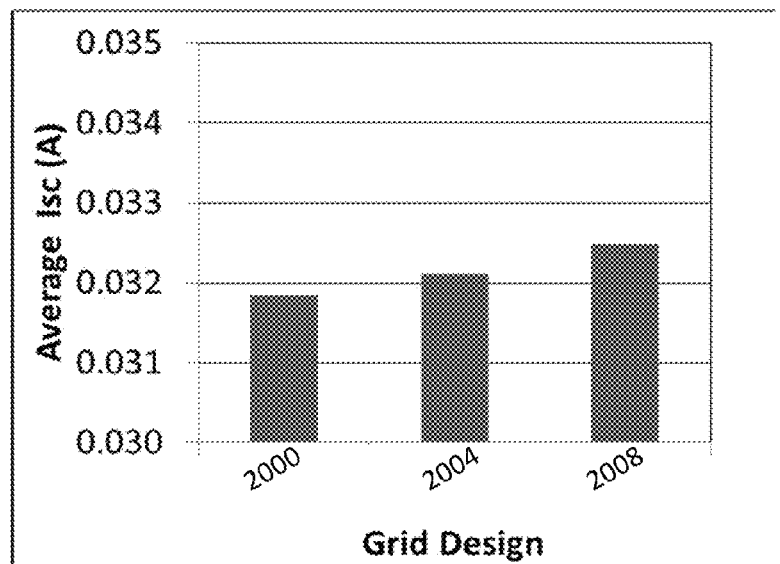
FIG. 18 shows the averaged short circuit current (Isc) for the transducers of FIGS. 15, 16, and 17.
Figure 19:
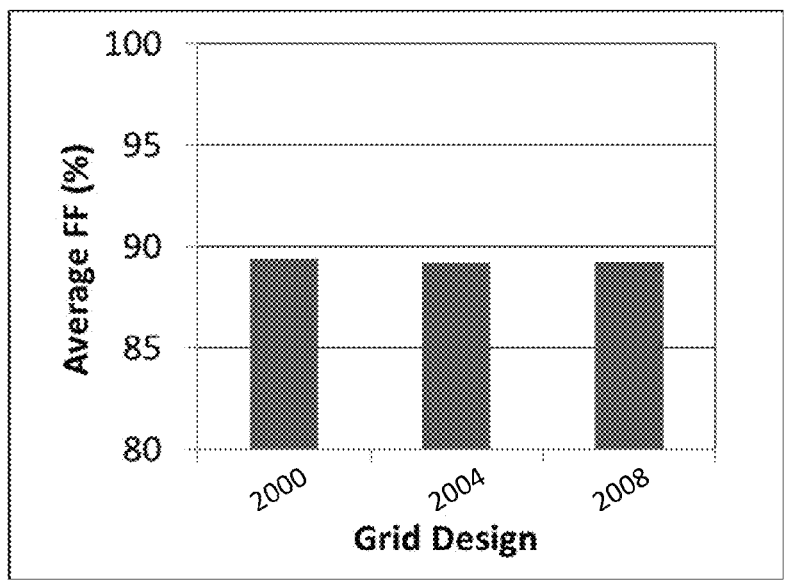
FIG. 19 shows fill factor data for the transducers of FIGS. 15, 16, and 17.

FIG. 18 shows the averaged short circuit current (Isc) for the transducers 2000, 2002, and 2004 of FIGS. 15, 16, and 17. FIG. 19 shows fill factor (FF) data for transducers 2000, 2002, and 2004 of FIGS. 15, 16, and 17. An incident beam of light with wavelengths centered around (substantially at) 850 nm was used to acquire the data. All devices had a transparent electrode made of InGaP doped to a doping level of $10^{18}$ $cm^{-3}$ and had five base segments. FIG. 18 a slightly higher Isc for the gridless transducer 2008, which is as expected. FIG. 19 shows that the FF is substantially the same for all the transducer 2000, 2004, and 2008. The FF is directly affected by the presence of any series resistance in the circuit, including that of the emitter and metal contact. The values of FF of FIG. 19 would be lower for the transducer 2008 without the presence of the transparent conductive InGaP electrode.

The transducer of the present disclosure has a well-defined and wide dynamic range response in voltage and current with respect to the optical input power. The current and Isc have a linear dependence on the input optical power and, Voc has a logarithmic response. The transducer of the present disclosure can therefore be used in applications where monitoring the intensity of a highly focused beam of monochromatic light is needed. Examples of applications may include continuous wave (CVV) and pulsed laser beams and focused light from LED's or other monochromatic sources of light. The use of a design with no grid lines is particularly useful when accurate power monitoring and measurements is required. This is because focused light beams may have beam diameters or spot sizes comparable to the widths and spacing of the grid lines, thereby introducing considerable errors from shadowing if the beam falls on or in between grid lines. Furthermore, high power density light beams can be problematic for prior art technologies using photo-diodes with limited power ratings. These will often require the use of additional bulky beam splitters and attenuators also sensitive to high power densities, to quench and attenuate the incident power of the beam to monitor.

Figure 20:
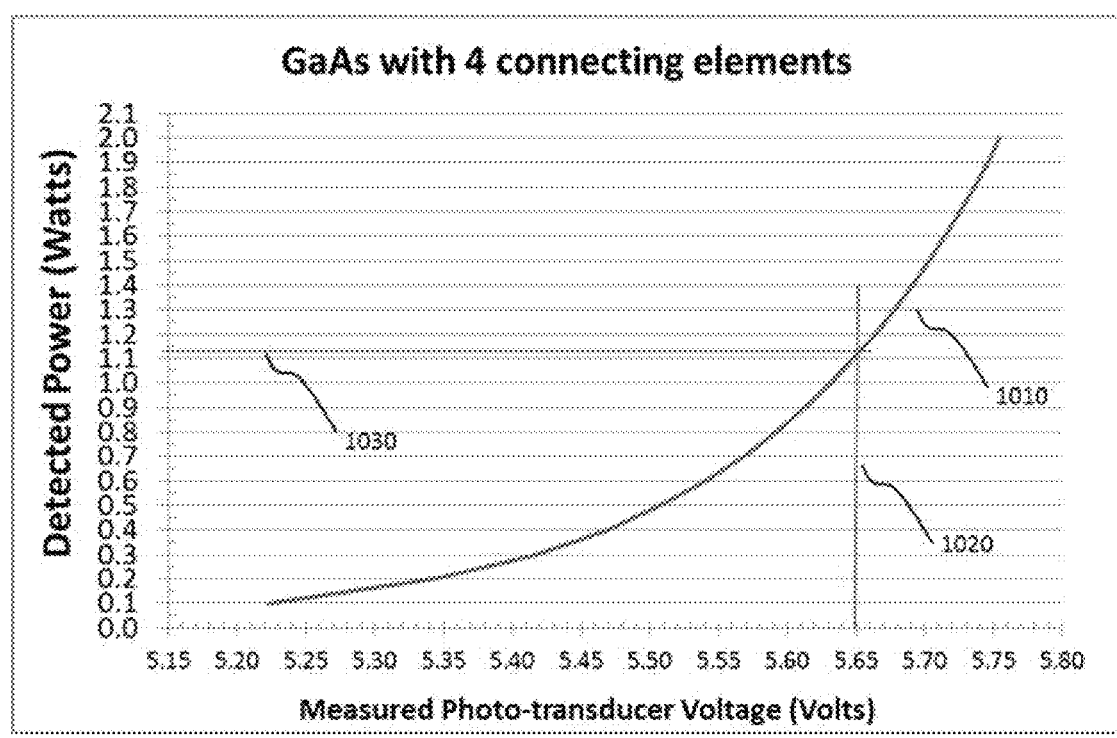
FIG. 20 shows a plot of detected power as a function of measure transducer voltage for an embodiment of a transducer of the present disclosure.

In the application for which the photo-transducer of the present disclosure is used as a power meter device, the photo-transducer can be equipped with a compact voltage readout circuit to compare the measured photo-transducer Voc to a calibration table containing the relationship between Voc and the input optical power. For example, the latter data can be stored in memory and a programmable logic circuitry can be used to output, on a display for example, the detected power. The stored information can contain the photo-voltage response data for various input wavelengths as illustrated in previous figures. The data for a given wavelength (here 830 nm) is illustrated in FIG. 20, where curve 1010 shows the calibrated relationship between Voc and the input optical power, vertical line 1020 is an example of measured Voc which could be detected with the photo-transducer, and the horizontal line 1030 which crosses the intersection of curve 1010 and line 1020 is the corresponding detected power, here expressed in Watts for FIG. 20.

As will be clear for one skill in the art, there are several benefits in using the photo-transducer of the present disclosure as a laser power meter. The benefits are not limited to, but include the following: as mentioned above, the optical input surface can be designed without any metal gridlines. The metal gridlines can absorb and scatter the laser light, giving errors in the measurements, possible increased safety hazards, and possibly leading to catastrophic failure of the power meter sensitive area in the case of high power input laser light which gets absorbed by the metal gridlines. Avoiding the gridlines is therefore advantageous. Furthermore, because of its construction based on a monolithically stacked designed with multiple base segments, the response photo-transducer of the present invention is not position-sensitive. That is the laser light can impinge different positions on the optical input areas without affecting significantly the detected power. Moreover, because of the very high optical to electrical conversion efficiency of the photo-transducer of the present invention, less wasted energy would be deposited in the optical active detecting head of such a power meter, therefore reducing the risk of damaging the device with the input light source.

Figure 22:
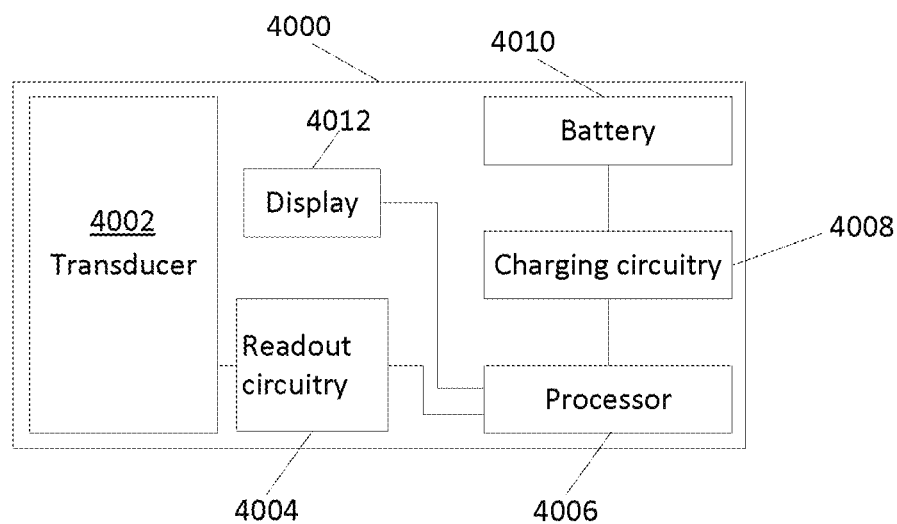
FIG. 22 shows an embodiment of a power meter in accordance with the present disclosure.

It will also be clear for one skill in the art that such a power meter utilizing the photo-transducer of the present disclosure could be operated, without departing from the scope of the present disclosure, in open circuit mode (Voc-mode), in short-circuit mode (Isc-mode), in maximum power point mode or voltage of maximum voltage power (Vmp-mode), or at other positions on the operational I-V curve of the photo-transducer. As will be understood by the skilled worker, it can be advantageous to operate the device near the maximum conversion efficiency point (near Vmp) to convert as much input optical power into electrical power. The converted power will avoid the need for evacuating excessive thermal loads, and the optical power which is converted into electrical power from the optical input can be stored, in rechargeable batteries for example. The stored power can then be used to run the electronic circuitry of the power meter. The latter configuration can be advantageous to reduce or avoid the need for recharging the power meter unit into an external source such as a wall plug, or for plugging rechargeable batteries into an external source such as a wall plug. For example, a compact handheld power meter, with no need for external power source other than a light source (e.g., laser source) to be measured, can be constructed with the photo-transducer of the present disclosure equipped simply with a rechargeable battery, a display, and a readout and logic circuitry to convert the measured data into displayed reading. The display can be a digital liquid crystal display or an analog dial. The power meter thus constructed could draw its power directly from the source to be measured if the laser power is high-enough. In the case for which small laser powers need to be measured, the power meter could be recharged externally from an electrical power source or an optical power source. FIG. 22 shows an example of such a power meter 4000 that comprises a transducer 4002 of the present disclosure, a readout circuitry 4004 that receives an electrical output from the transducer 4002 (e.g., the output voltage of the transducer 4002), a processor 4006 operationally connected to the readout circuitry 4004. The processor 4006 is configured to provide an electrical signal to a charging circuitry 4008, which charges a battery 4010. A display 4012 in operationally connected to the processor 4006; the display can show a value of the optical power to which the transducer 4002 is subjected.

In other embodiments, the present disclosure provides a compact handheld power meter, with no need for external power source other than a laser source to be measured. The power meter in question can comprise the photo-transducer of the present disclosure equipped with a rechargeable battery and readout and logic circuitry configured to obtain data and to provide the data wirelessly to a mobile device equipped with software to read and display, on the mobile device, the data.

In general, and in the context of the present disclosure, two components are "electrically connected" when an electrical change caused by or affecting one (such as a change in voltage or current) can result in an electrical change in the other or, when an electrical signal sent by one can be received by the other. The two components need not be directly electrically connected (that is, there may be other elements interposed between them).

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit and an upper limit is disclosed, any number falling within the range is specifically disclosed. Additionally, the use of the term "substantially" means +/−10% of a reference value, unless otherwise stated. As an example, the phrase: "voltage A is substantially the same as voltage B" means that voltage B is within +/−10% of voltage B.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

The above-described embodiments are intended to be examples only. Alterations, modifications and variations can be effected to the particular embodiments by those of skill in the art without departing from the scope, which is defined solely by the claims appended hereto.

What is claimed is:

1. A transducer to convert optical energy to electrical energy, the transducer comprising:
   a semiconductor emitter layer, the semiconductor emitter being one of n-doped and p-doped;
   semiconductor base layers, the semiconductor base layers being p-doped when the semiconductor emitter layer is n-doped, the semiconductor base layers being n-doped when the semiconductor emitter layer is p-doped, the semiconductor emitter layer and the semiconductor base layers each having a same bandgap energy, one of the semiconductor base layers adjoining the semiconductor emitter layer to form a p-n junction having associated thereto a first electric potential; and
   at least one connecting element formed between adjacent semiconductor base layers to electrically connect the adjacent semiconductor base layers to each other, each connecting element being configured to generate a respective additional electric potential between the adjacent semiconductor base layers;
   the transducer having an overall electric potential that consists of the sum of the first electric potential and of each respective additional electric potential, each respective additional electric potential being equal to the first electric potential;
   the transducer to receive light that propagates through, and is partially absorbed in, the semiconductor emitter layer and then sequentially propagates through, and is partially absorbed in, each of the semiconductor base layers, each semiconductor base layer having a thickness designed to absorb a same number of photons.

2. The transducer of claim 1 wherein:
   the transducer is to convert the optical energy of a light signal having associated thereto a wavelength, and
   the semiconductor emitter layer and each of the semiconductor base layers have associated thereto a bandgap, the bandgap being substantially equal to a photon energy of the light signal.

3. The transducer of claim 2 wherein:
   each connecting element comprises a tunnel diode unit and a semiconductor intermediate layer adjoining the tunnel diode unit and a semiconductor base layer, the semiconductor intermediate layer has a bandgap equal to, or greater than, the photon energy of the light signal, the semiconductor intermediate layer is n-doped when the semiconductor base layers are p-doped, and the semiconductor intermediate layer being p-doped when the semiconductor base layer are n-doped.

4. The transducer of claim 1 wherein:

the semiconductor emitter layer includes GaAs and n-type dopants, and the semiconductor base layers include GaAs and p-type dopants.

5. The transducer of claim 1 wherein:

the semiconductor emitter layer includes GaAs and p-type dopants, and the semiconductor base layers include GaAs and n-type dopants.

6. The transducer of claim 1 further comprising a substrate upon which are formed the semiconductor base layers, the connecting elements and the semiconductor emitter layer.

7. The transducer of claim 6 wherein the substrate is one of a GaAs substrate and a Ge substrate.

8. The transducer of claim 1 wherein:

the semiconductor emitter layer and the semiconductor base layers comprise Ge, the semiconductor emitter layer comprises n-type dopants, and the semiconductor base layers comprise p-type dopants.

9. The transducer of claim 1 wherein:

the semiconductor emitter layer and the semiconductor base layers comprise Ge, the semiconductor emitter layer comprises p-type dopants, and the semiconductor base layers comprise n-type dopants.

10. The transducer of claim 1 wherein:

the semiconductor emitter layer and the semiconductor base layers comprise InP, the semiconductor emitter layer comprises n-type dopants, and the semiconductor base layers comprise p-type dopants.

11. The transducer of claim 1 wherein:

the semiconductor emitter layer and the semiconductor base layers comprise InP, the semiconductor emitter layer comprises p-type dopants, and the semiconductor base layers comprise n-type dopants.

12. The transducer of claim 1 wherein:

the semiconductor emitter layer and the semiconductor base layers comprise Si, the semiconductor emitter layer comprises n-type dopants, and the semiconductor base layers comprise p-type dopants.

13. The transducer of claim 1 wherein:

the semiconductor emitter layer and the semiconductor base layers comprise Si, the semiconductor emitter layer comprises p-type dopants, and the semiconductor base layers comprise n-type dopants.

14. The transducer of claim 1 wherein:

the semiconductor emitter layer and the semiconductor base layers comprise GaSb, the semiconductor emitter layer comprises n-type dopants, and the semiconductor base layers comprise p-type dopants.

15. The transducer of claim 1 wherein:

the semiconductor emitter layer and the semiconductor base layers comprise GaSb, the semiconductor emitter layer comprises p-type dopants, and the semiconductor base layers comprise n-type dopants.

16. The transducer of claim 1 wherein:

the semiconductor emitter layer and the semiconductor base layers comprise at least one of GaN, InN, InGaAlN, InGaAlAsP and InGaAs, the semiconductor emitter layer comprises n-type dopants, and the semiconductor base layers comprise p-type dopants.

17. The transducer of claim 1 wherein:

the semiconductor emitter layer and the semiconductor base layers comprise at least one of GaN, InN, InGaAlN, InGaAlAsP and InGaAs, the semiconductor emitter layer comprises p-type dopants, and the semiconductor base layers comprise n-type dopants.

18. A transducer to convert optical energy to electrical energy, the transducer comprising:

a light-input surface;

a semiconductor emitter layer, the semiconductor emitter being one of n-doped and p-doped;

semiconductor base layers, the semiconductor base layers being p-doped when the semiconductor emitter layer is n-doped, the semiconductor base layers being n-doped when the semiconductor emitter layer is p-doped, the semiconductor emitter layer and the semiconductor base layers each having substantially a same bandgap energy, one of the semiconductor base layers adjoining the semiconductor emitter layer to form a p-n junction having associated thereto a first electric potential; and at least one connecting element formed between adjacent semiconductor base layers to electrically connect the adjacent semiconductor base layers to each other, each connecting element being configured to generate a respective additional electric potential between the adjacent semiconductor base layers, the transducer having an overall electric potential that consists of the sum of the first electric potential and of each respective additional electric potential, each respective additional electric potential being equal to the first electric potential, the light-input surface to receive light and to transmit the light to the semiconductor emitter layer, the light to propagate through, and be partially absorbed in, the semiconductor emitter layer and to sequentially propagate through, and be partially absorbed in, each of the semiconductor base layers, each semiconductor base layer having a thickness designed to absorb a same number of photons.

19. A transducer and data receiver unit comprising:

a transducer to convert optical energy to electrical energy, the transducer having:

a semiconductor emitter layer, the semiconductor emitter being one of n-doped and p-doped;

semiconductor base layers, the semiconductor base layers being p-doped when the semiconductor emitter layer is n-doped, the semiconductor base layers being n-doped when the semiconductor emitter layer is p-doped, the semiconductor emitter layer and the semiconductor base layers each having a same bandgap energy, one of the semiconductor base layers adjoining the semiconductor emitter layer to form a p-n junction having associated thereto a first electric potential; and at least one connecting element formed between adjacent semiconductor base layers to electrically connect the adjacent semiconductor base layers to each other, each connecting element being configured to generate a respective additional electric potential between the adjacent semiconductor base layers, the transducer having an overall electric potential that that consists of the sum of the first electric potential and of each respective additional electric potential, each respective additional electric potential being equal to the first electric potential, the transducer to receive light that propagates through, and is partially absorbed in, the semiconductor emitter layer and then sequentially propagates through, and is partially absorbed in, each of the semiconductor base layers, each semiconductor base layer having a thickness designed to absorb a same number of photons; and an optical signal detector to detect an optical data signal having associated thereto a photon energy that is less than a photon energy of the light absorbed in the transducer unit, the optical detector comprising a Ge substrate and a p-n junction formed in the Ge substrate, the transducer unit being formed upon the Ge substrate.

20. A power meter unit comprising:

a transducer to convert optical energy to electrical energy, the transducer comprising:

a light-input surface;

a semiconductor emitter layer, the semiconductor emitter being one of n-doped and p-doped;

semiconductor base layers, the semiconductor base layers being p-doped when the semiconductor emitter layer is n-doped, the semiconductor base layers being n-doped when the semiconductor emitter layer is p-doped, the semiconductor emitter layer and the semiconductor base layers each having substantially a same bandgap energy, one of the semiconductor base layers adjoining the semiconductor emitter layer to form a p-n junction having associated thereto a first electric potential; and at least one connecting element formed between adjacent semiconductor base layers to electrically connect the adjacent semiconductor base layers to each other, each connecting element being configured to generate a respective additional electric potential between the adjacent semiconductor base layers, the transducer having an overall electric potential that consists of the sum of the first electric potential and of each respective additional electric potential, each respective additional electric potential being equal to the first electric potential, the light-input surface to receive light and to transmit the light to the semiconductor emitter layer, the light to propagate through, and be partially absorbed in, the semiconductor emitter layer and to sequentially propagate through, and be partially absorbed in, each of the semiconductor base layers, each semiconductor base layer having a thickness designed to absorb a same number of photons, readout circuitry operationally connected to the transducer, the readout circuitry to obtain a signal from the transducer, the signal being indicative of an optical power of light impinging on the transducer, the readout circuit to generate an output electrical signal;

a processor operationally connected to the readout circuitry, the processor to obtain the output electrical signal;

charging circuitry operationally connected to the processor; and a battery operationally connected to the charging circuitry, the processor to control the charging circuitry to charge the battery in accordance with the electric signal.

* * * * *